US012740366B2

(12) United States Patent
Tsai et al.

(10) Patent No.: US 12,740,366 B2
(45) Date of Patent: Sep. 15, 2026

(54) METHODS AND SYSTEMS FOR A SPECTRAL LIBRARY AT A MANUFACTURING SYSTEM

(71) Applicant: Applied Materials, Inc., Santa Clara, CA (US)

(72) Inventors: Hsinyi Tsai, Hsinchu City (TW); Thomas Li, Santa Clara, CA (US); Zhaozhao Zhu, Milpitas, CA (US); Michael Kutney, Santa Clara, CA (US); Upendra V. Ummethala, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 413 days.

(21) Appl. No.: 18/485,009

(22) Filed: Oct. 11, 2023

(65) Prior Publication Data

US 2024/0128100 A1 Apr. 18, 2024

Related U.S. Application Data

(60) Provisional application No. 63/480,476, filed on Jan. 18, 2023, provisional application No. 63/379,638, filed on Oct. 14, 2022.

(51) Int. Cl.
*H10P 72/00* (2026.01)
*H10P 74/00* (2026.01)

(52) U.S. Cl.
CPC ...... *H10P 72/0604* (2026.01); *H10P 72/0618* (2026.01); *H10P 74/238* (2026.01)

(58) Field of Classification Search
CPC ............. H10P 72/0604; H10P 72/0618; H10P 74/238; H10P 74/203; G05B 19/418;
(Continued)

(56) References Cited

U.S. PATENT DOCUMENTS

| | | | |
|---|---|---|---|
| 6,261,470 | B1 | 7/2001 | Smith, Jr. et al. |
| 2018/0182632 | A1 | 6/2018 | Kumar et al. |

(Continued)

FOREIGN PATENT DOCUMENTS

| | | | |
|---|---|---|---|
| JP | 2004534399 | A | 11/2004 |
| JP | 2005527984 | A | 9/2005 |

(Continued)

OTHER PUBLICATIONS

PCT International Search Report and Written Opinion for International Application No. PCT/US2023/076738 mailed Jan. 29, 2024, 9 pages.

*Primary Examiner* — Mohammad Ali
*Assistant Examiner* — Sheela Rao
(74) *Attorney, Agent, or Firm* — Lowenstein Sandler LLP

(57) ABSTRACT

Spectral data associated with one or more regions of a surface of a substrate is identified. The substrate has been processed according to one or more first operations of a process recipe that is unknown to a system controller for the manufacturing system. The spectral data is provided as input to a machine learning model that is trained to predict, based on given spectral data, a respective process recipe associated with the substrate and one or more operations of the respective process recipe that have already been performed. A determination is made, based on one or more outputs of the machine learning model, that the substrate is associated with the process recipe and that one or more second operations are yet to be performed. The substrate is caused to be processed according to the one or more second operations of the process recipe.

18 Claims, 10 Drawing Sheets

(58) Field of Classification Search
CPC ...... G05B 2219/45031; G05B 13/0265; G05B 13/048; G06N 20/00
See application file for complete search history.

(56) References Cited

U.S. PATENT DOCUMENTS

| | | | |
|---|---|---|---|
| 2022/0028713 | A1 | 1/2022 | Ummethala et al. |
| 2022/0028716 | A1 | 1/2022 | Ummethala et al. |
| 2022/0066411 | A1 | 3/2022 | Ummethala et al. |
| 2022/0198326 | A1 | 6/2022 | King |
| 2022/0214662 | A1 | 7/2022 | Panda et al. |
| 2025/0156058 | A1* | 5/2025 | Lin ....................... G06F 3/0481 |

FOREIGN PATENT DOCUMENTS

| | | | |
|---|---|---|---|
| WO | 1999054694 | A1 | 10/1999 |
| WO | 2003005412 | A2 | 1/2003 |
| WO | 2003103017 | A2 | 12/2003 |
| WO | 2022020524 | A1 | 1/2022 |

* cited by examiner

METHODS AND SYSTEMS FOR A SPECTRAL LIBRARY AT A MANUFACTURING SYSTEM

RELATED APPLICATION

This application claims benefit of U.S. Provisional Patent Application No. 63/480,476, filed Jan. 18, 2023 and U.S. Provisional Patent Application No. 63/379,638, filed Oct. 14, 2022, the entire content of which are incorporated by reference herein.

TECHNICAL FIELD

Embodiments of the present disclosure relate, in general, to manufacturing systems and more particularly methods and systems for a spectral library at a manufacturing system.

BACKGROUND

Substrate processing can include a series of processes that are carried out in one or more process chambers of a manufacturing system. For example, a substrate can be processed according to a deposition process, an etch process, etc. In some instances, a process chamber can stop working during performance of a substrate process. For example, a manufacturing system that includes a process chamber performing a substrate process can lose power and the substrate process can be unexpectedly terminated at the process chamber. When power is restored to the manufacturing system, a system controller for the manufacturing system may be unaware of the particular substrate at the process chamber and/or the substrate process that was being performed for the substrate when power was lost to the process tool.

In some instances, conditioning operations can be performed at a process chamber to bring the process chamber to a condition that is suitable for substrate processes. For example, performing substrate processes can cause wear to process chamber components of the process chamber and/or to interior surfaces of the process chamber. Substrate processing may be temporarily paused at a process chamber for a time period so that maintenance processes (e.g., preventative maintenance processes, corrective maintenance processes, etc.) can be performed to correct and/or mitigate the wear or damage to the process chamber components and/or the interior of the process chamber. One or more conditioning operations can be performed as part of the maintenance process. Once the maintenance process is completed and the process chamber is restored to a condition that is suitable for substrate processes, the process chamber can resume substrate processing.

SUMMARY

Some of the embodiments described cover a method and system for preventing misprocessing of substrates at a manufacturing system. The method includes identifying spectral data associated with a substrate processed at a manufacturing system according to one or more first operations of a process recipe. The process recipe is unknown to a system controller for the manufacturing system. The method further includes determining the process recipe associated with the substrate based on the identified spectral data. The method further includes identifying one or more second operations of the process recipe for the substrate. The method further includes causing the substrate to be processed according to the one or more second operations of the process recipe.

Some of the embodiments described cover a method and system for monitoring a conditioning process at a process chamber of a manufacturing system. The method includes identifying spectral data associated with a first substrate at a manufacturing system. The first substrate has been processed at a process chamber of the manufacturing system according to one or more first operations of a chamber conditioning process for the process chamber. The method further includes determining a condition of the process chamber after performance of the one or more first operations based on the identified spectral data. The method further includes determining whether the condition of the process chamber satisfies one or more chamber condition criteria. The method further includes responsive to determining that the condition of the process chamber fails to satisfy the one or more chamber condition criteria, updating one or more second operations of the chamber conditioning process to cause the condition of the process chamber to satisfy the one or more chamber condition criteria. The method further includes causing a second substrate to be processed at the process chamber according to the updated one or more second operations.

BRIEF DESCRIPTION OF THE DRAWINGS

The present disclosure is illustrated by way of example, and not by way of limitation, in the figures of the accompanying drawings in which like references indicate similar elements. It should be noted that different references to “an” or “one” embodiment in this disclosure are not necessarily to the same embodiment, and such references mean at least one.

DETAILED DESCRIPTION OF EMBODIMENTS

Figure 1:
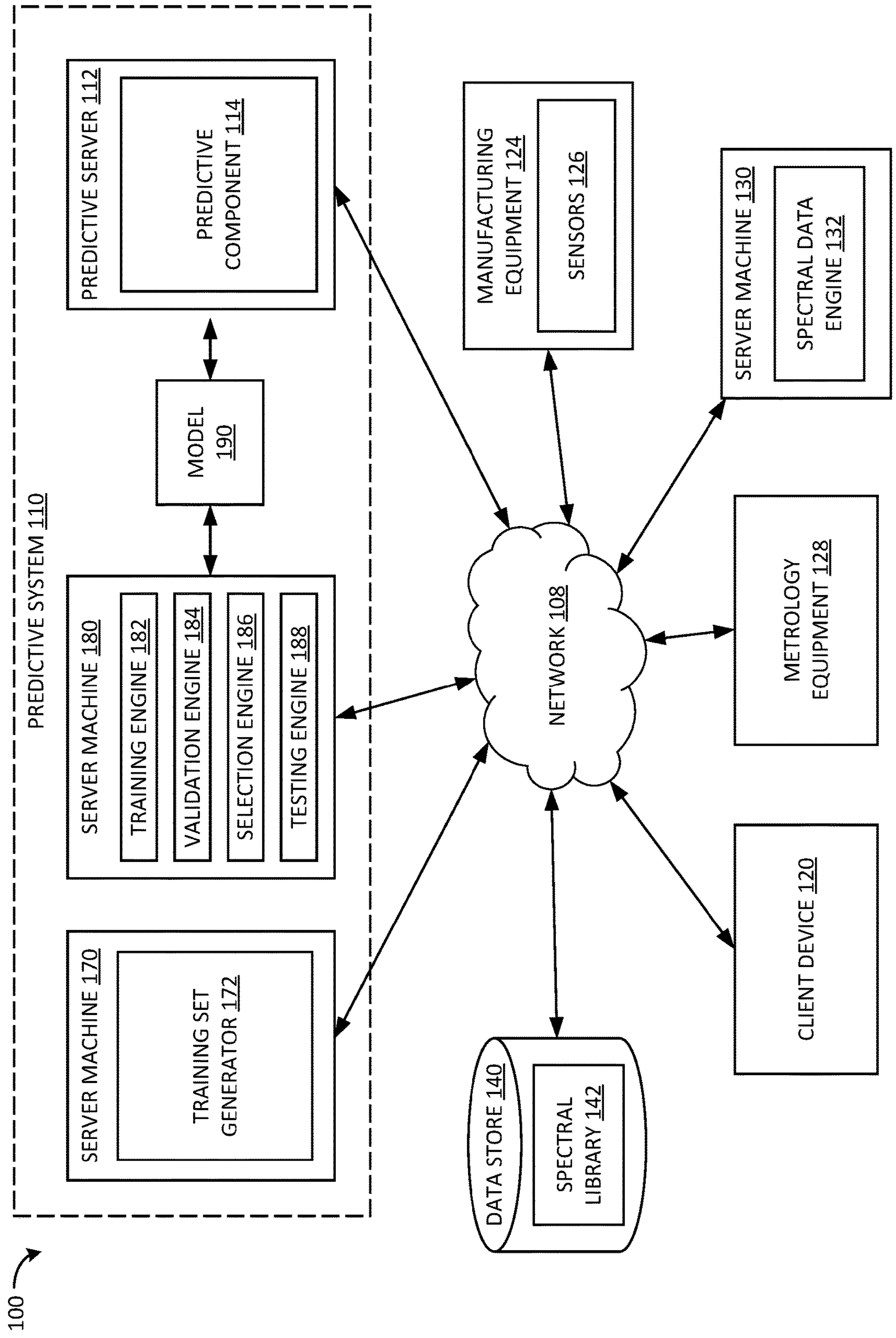
FIG. 1 depicts an illustrative computer system architecture, according to aspects of the present disclosure.

Implementations described herein provide methods and systems for a spectral library at a manufacturing system. In particular, implementations described herein provide a method and system for preventing misprocessing of substrates at a manufacturing system. Implementations described herein additionally or alternatively provide a method and system for monitoring a conditioning process at a process chamber of a manufacturing system.

Substrate processing can include a series of processes that produces electrical circuits in a semiconductor (e.g., a silicon wafer, etc.) in accordance with a circuit design. Such substrate processes can be carried out using substrates placed in one or more process chambers at a process tool of the manufacturing system. A substrate process can include a deposition process, an etch process, and so forth. A deposition process involves depositing one or more layers of materials on a surface of a substrate placed within a process chamber. An etch process involves transferring a pattern of a mask material into one or more layers of material on the surface of the substrate. For example, after a substrate is placed in a process chamber, an etching plasma can be flowed into the process chamber and can remove (e.g., etch) away portions of the layers of material on the surface of the substrate that are not covered by the mask material. The portions of the layers that remain after the etching process can have the same or a similar pattern as the pattern of the mask material. Production substrates, as referred to herein, include any substrate that is processed according to a substrate process (e.g., an etch process, a deposition process, etc.).

In some instances, a system controller of a manufacturing system can lose track of one or more substrates that are being processed at the manufacturing system. For example, the manufacturing system can lose power (e.g., due to a weather event, a system failure, etc.) while a substrate process is being performed for a substrate at a process chamber. The state of substrates and/or process chambers at the manufacturing system may not have been stored to a memory for the system controller prior to the power loss. Accordingly, when power is restored to the manufacturing system, the system controller may be unaware of which substrate is located at each process chamber and/or which operations of a substrate process were performed for the substrates before the power loss. In another example, a computing system for the system controller may be reset or restarted while one or more substrates are being processed at the manufacturing system (e.g., due to a failure at the computing system, to perform an emergency update of software or firmware running at the computing system, etc.). After the computing system is reset or restarted, the system controller may be unaware of the state of the substrates and/or the process chambers, as indicated above.

In some manufacturing systems, substrates can include one or more identifying marks that are unique to each respective substrate. For example, a unique serial number can be printed or otherwise formed onto a surface of a substrate to differentiate the substrate from other substrates at the manufacturing system. Such identifying marks are referred to as substrate identifiers (IDs) herein. After a system controller loses track of one or more substrates, as described above, a substrate at a process chamber can be transferred to a substrate identifier station that can scan the surface of the substrate for a substrate ID. After the substrate ID is identified, the substrate identifier (ID) station can transmit an indication of the substrate ID to the system controller. The system controller can identify a process recipe for the substrate based on the substrate ID and can determine whether to continue processing the substrate according to the process recipe (e.g., by performing one or more operations that were to be performed had the system controller not lost track of the substrate) or to terminate processing of the substrate and to initiate the substrate process for another substrate (e.g., to replace the substrate).

An interior environment of a process chamber and/or other stations of a process tool can be under vacuum and/or can be highly controlled to prevent oxygen, moisture, etc. from impacting a quality of a substrate processed at the chamber. A substrate ID station can be external from the process chamber and/or the process tool and accordingly, the substrate is removed from the interior environment of the process tool when transferred to the substrate ID station. In some instances, exposing the substrate to the external environment of the process tool before each operation of the substrate process is completed can damage the substrate. The substrate may become unusable, and the system controller may initiate the substrate process for one or more other substrates to replace the damaged substrate. In other or similar instances, the substrate ID station can be or otherwise include a substrate ID scanner device. An operator of the manufacturing system may open the lid of the process chamber that includes the substrate and scanning the substrate ID on the surface of the substrate using the substrate ID scanner device. By opening the lid to the process chamber, the substrate and the interior environment of the process chamber is exposed to the external environment of the process tool, which can damage the substrate and/or introduce undesired particles (e.g., oxygen, moisture, etc.) into the process chamber. The substrate can become unusable, as described above. In some instances, one or more conditioning operations may be performed at the process chamber (e.g., after the substrate is removed) to bring the process chamber back to a condition that is suitable for processing substrates. Performing substrate processes on additional substrates (e.g., to replace damaged substrates) and/or performing process chamber conditioning operations can decrease an overall throughput and an overall efficiency of a manufacturing system and can increase an overall latency of the manufacturing system.

In some embodiments, chamber conditioning operations can be performed at a process chamber as part of an initialization process and/or a maintenance process for the process chamber. An initialization process refers to a process to prepare the process chamber to perform a particular substrate process (e.g., an etch process, a deposition process, etc.). The initialization process can be performed when the process chamber is first used at the process tool and/or when the process chamber was previously used for a particular substrate process (e.g., a deposition process) and is now to be used for a different substrate process (e.g., an etch process). A maintenance process can be periodically performed to correct and/or mitigate wear or damage to process chamber components and/or an interior of the process chamber. A maintenance process can be a preventative maintenance (PM) process and/or a corrective maintenance (CM) process. A PM process refers to a maintenance process that is performed according to a routine maintenance schedule to maintain one or more components of the process chamber and/or mitigate wear to an interior of the process chamber. A CM process refers to a maintenance process to correct or mitigate a failure of one or more process chamber components that is detected before, during, or after completion of a substrate process (e.g., between the performance of scheduled PM processes).

A chamber conditioning operation can involve etching one or more substrates (e.g., blank silicon wafers or dummy wafers) to bring the interior of the process chamber to a condition that is suitable for substrate processes. Substrates that are processed during chamber condition operations are referred to herein as chamber conditioning substrates or simply as conditioning substrates. Substrates that are processed during a substrate process (e.g., for producing an electrical device, etc.) are referred to herein as production substrates. In some systems, metrology is used to determine whether an interior of a process chamber is at a condition that is suitable for production substrate processing. For example, after a chamber conditioning operation is completed, the conditioning substrate is transferred from the process chamber to metrology equipment. The metrology equipment can be located externally to the process tool including the process chamber and the conditioning substrate accordingly is removed from a vacuum environment of the process tool during transfer to the metrology equipment. The metrology equipment performs obtains metrology measurement values for the conditioning substrate (e.g., critical dimension (CD) measurement values, etch rate measurement values, etc.), which can be used (e.g., by a system controller) to determine whether a chamber condition is met (e.g., whether the obtained metrology measurement values correspond to target metrology measurement values for the chamber). Subsequent conditioning operations can be performed at the process chamber until the chamber condition is met and/or a threshold number of conditioning substrates are processed. Once the chamber condition is met and/or the threshold number of conditioning substrates are processed, the process chamber is determined to be restored to a condition that is suitable for substrate processes and the process chamber can be used for production substrate processing.

The amount of time between taking a process chamber offline to perform conditioning operations and bring a process chamber back online for production substrate processing is referred to as green-to-green (G2G) time. As the amount of G2G time for a process chamber increases, the overall number of production substrates processed by the process chamber decreases, which can reduce an overall efficiency and throughput, and increase an overall latency for the process chamber and for the manufacturing system. As indicated above, for each conditioning operation performed at a process chamber, conditioning substrates are removed from the process chamber and transferred to metrology equipment for measurement, which can be external from the process tool. Transferring conditioning substrates to the metrology equipment and obtaining metrology measurements for the conditioning substrates can take a significant amount of time, which can increase the G2G time for the process chamber. In some systems, as initial conditioning substrates are transferred from a process chamber and measured by external metrology equipment, additional conditioning operations may be performed for subsequent conditioning substrates at the process chamber. The process chamber may have been restored to a condition that is suitable for processing production substrates after the conditioning operations for the initial conditioning substrates and therefore the additional conditioning operations initiated while the initial conditioning substrates are transferred and measured may be unnecessary. The additional conditioning operations can therefore increase the G2G time for the process chamber and unnecessarily consume resources (e.g., processing resources, computing resources, etc.) for the manufacturing system, which can further reduce the efficiency and throughput and increase the overall latency for the manufacturing system.

Aspects of the present disclosure address the above noted and other deficiencies by providing methods and systems for a spectral library at a manufacturing system. Spectral data can be collected for a substrate (e.g., a production substrate, a conditioning substrate, etc.) before, during or after performance of a process at a process chamber. In some embodiments, the spectral data can be collected by a substrate measurement subsystem, such as substrate measurement subsystem 300 of FIG. 3. Spectral data can include or otherwise correspond to an intensity (i.e., a strength or amount of energy) of each wavelength of a detected wave of energy reflected from a surface of the substrate. The spectral data can be used to prevent misprocessing of substrates at the manufacturing system and/or for monitoring a conditioning process at a process chamber of the manufacturing system, in accordance with embodiments described herein.

In some embodiments, a production substrate can be transferred to a process chamber for processing according to a substrate process (e.g., an etch process, a deposition process, etc.). Before, during, or after the performance of the substrate process, a system controller for the manufacturing system can lose track of the production substrate and can become unaware of a type of the production substrate, a process recipe associated with the production substrate and/or one or more operations of the process recipe that have been performed and/or are to be performed for the production substrate. In an illustrative example, the manufacturing system can lose power before, during, or after the substrate process. In another example, the system controller may be reset or restarted (e.g., by an operator of the manufacturing system) before, during, or after the substrate process. In some embodiments, the substrate measurement subsystem can collect spectral data for one or more regions of a surface of the substrate The substrate measurement subsystem can be configured to collect the spectral data for the substrate while the substrate is at the process chamber, in some embodiments. In other or similar embodiments, the substrate measurement subsystem can be included in or otherwise connected to a region of the process tool (e.g., a transfer chamber) that has an interior environment that is at the same or similar conditions as the process chamber (e.g., is under vacuum, has a minimal amount of oxygen, moisture, etc.). The substrate can be transferred from the process chamber to the substrate measurement subsystem for measurement. In such embodiments, the substrate can be measured in the controlled environment of the process tool and is not removed from the process tool and exposed to the external environment for measurement.

The substrate measurement subsystem can collect spectral data for the production substrate and can transmit the collected spectral data (e.g., via a network) to the system controller or another computing system of the manufacturing system. The system controller can determine the process recipe associated with the production substrate based on the collected spectral data and spectral data of a spectral library, in some embodiments. The spectral library can include spectral data collected for prior substrates processed according to one or more prior substrate processes at the manufacturing system. In some embodiments, the system controller can compare the spectral data collected for the production substrate to the spectral data of the spectral library and can identify prior spectral data that corresponds to the collected spectral data. Upon identifying the prior spectral data that corresponds to the collected spectral data, the system controller can determine a prior substrate for which the prior spectral data was collected. In some embodiments, the spectral library can indicate a process that was performed for the prior substrate and/or one or more operations of a process recipe for the process that were performed and/or yet to be performed for the prior substrate. In other or similar embodiments, the spectral library can indicate an identifier associated with the prior substrate. The system controller can determine the process performed for the prior substrate and/or the operations of the process recipe for the process based on data stored at a memory for the manufacturing system, in such embodiments. In response to determining the process recipe associated with the production substrate and/or one or more operations that are to be performed and/or are yet to be performed for the substrate based on the collected spectral data, the system controller can cause the substrate to be processed according to the one or more operations that are yet to be performed.

The spectral library can include spectral data collected for a large number of prior substrates (e.g., thousands, tens of thousands, hundreds of thousands, etc.) processed at the manufacturing system. In some embodiments, data of the spectral library can be used to train a machine learning model to predict, based on given spectral data collected for a substrate, a process recipe associated with the production substrate and/or one or more operations that have been performed and/or are yet to be performed for the production substrate. Further details regarding the spectral library and the machine learning model are provided herein.

In additional or alternative embodiments, one or more conditioning operations can be performed at a process chamber of the manufacturing system using one or more conditioning substrates. In an illustrative example, the conditioning operation(s) can be performed by etching the conditioning substrates at the process chamber, in some embodiments. The substrate measurement system can collect spectral data associated with one or more regions of the conditioning substrate(s) before, during, and/or after performance of the conditioning operation(s). As described above, the substrate measurement subsystem can be configured to collect spectral data for a substrate while the substrate is disposed within a process chamber. In such embodiments, the substrate measurement subsystem can collect the spectral data for the substrate while the substrate is at the process chamber (e.g., before, during, or after performance of the conditioning operation(s)). In other or similar embodiments, the substrate can be transferred (e.g., by one or more robotic arms) to the substrate measurement subsystem for measurement after performance of a conditioning operation at the process chamber. In either embodiment, the substrate measurement subsystem can transmit the spectral data collected for the conditioning substrate to the system controller, or another computing system of the manufacturing system.

The system controller, or the other computing system. can determine a condition of the process chamber before, during, or after the performance of the conditioning operation(s) based on the spectral data collected for the substrate. The spectral data can indicate a condition or state of the substrate before, during or after the performance of the conditioning operation(s). The condition or state of the substrate can correspond to the condition or state of the process chamber before, during, or after the operation(s) are performed. Accordingly, the spectral data for the substrate can indicate the condition of the chamber before, during, or after the performance of the conditioning operation(s). In some embodiments, the system controller can determine the condition of the process chamber based on the collected spectral data and spectral data of the spectral library. In some embodiments, the spectral library can include spectral data collected for prior conditioning substrates processed according to one or more prior conditioning operations at a process chamber of the manufacturing system. In other or similar embodiments, the spectral library can be the same or similar as the library described above. The system controller can compare the spectral data collected for the conditioning substrate(s) with prior spectral data collected for prior conditioning substrates processed according to one or more prior conditioning operations at the manufacturing system and can identify prior spectral data that corresponds to the collected spectral data. Upon identifying the prior spectral data that corresponds to the collected spectral data, the system controller can determine a prior conditioning substrate for which the prior spectral data was collected. In some embodiments, the spectral library can indicate a condition of the prior conditioning substrate and/or a condition of the process chamber that processed the prior conditioning substrate. The system controller can determine the condition of the process chamber used to process the current conditioning substrate based on the condition of the prior conditioning substrate and/or the condition of the process chamber that processed the prior conditioning substrate, in some embodiments.

Upon determining the condition of the process chamber based on the spectral data collected for the conditioning substrate(s) processed at the process chamber, the system controller can determine whether the condition of the process chamber satisfies one or more chamber condition criteria (e.g., whether the process chamber is in a condition that is suitable for processing production substrates). If the system controller determines that the one or more chamber condition criteria are satisfied, the system controller can determine that the initialization process and/or the maintenance process for the process chamber is complete and the system controller can initiate processing of production substrates at the process chamber. If the system controller determines that the criteria are not satisfied, the system controller can update the initialization process and/or the maintenance process based on the determined condition of the chamber. In one example, the system controller can determine, based on the collected spectral data, that one or more additional conditioning operations are to be performed for the process chamber. In another example, the system controller can determine, based on the collected spectral data, that settings of the one or more additional conditioning operations are to be modified to cause the condition of the chamber to correspond to a target condition. The system controller can cause the operations of the updated initialization process and/or maintenance process to be performed at the process chamber, in some embodiments.

As indicated above, the spectral library can include spectral data collected for a large number of conditioning substrates (e.g., thousands, tens of thousands, hundreds of thousands, etc.) processed at the manufacturing system. In some embodiments, data of the spectral library can be used to train a machine learning model to predict, based on given spectral data collected for a conditioning substrate, a condition of a process chamber before, during, or after a conditioning operation for the conditioning substrate. The system controller can, in some embodiments, feed (e.g., continuously) spectral data collected for conditioning substrates processed at a process chamber as input to the trained machine learning model. Once the system controller determines, based on one or more outputs of the trained model, that a condition of the process chamber satisfies the one or more chamber condition criteria, the system controller can determine that the initialization process and/or the maintenance process for the process chamber is complete, as described above. Further details regarding the spectral library and the machine learning model are provided herein.

Aspects of the present disclosure address deficiencies of the conventional technology by providing techniques for preventing misprocessing of substrates at a manufacturing system and monitoring a conditioning process at a process chamber of a manufacturing system. A system controller (or another computing system) that has lost track of one or more substrates (e.g., production substrates) at a manufacturing system can use spectral data collected by the one or more substrates (e.g., by a substrate measurement subsystem) to determine a process recipe associated with the substrate(s) and/or one or more operations that have been performed and/or are yet to be performed for the substrate(s). The spectral data can be collected by the substrate measurement subsystem without the substrates being removed from a process tool and exposed to an external environment of the process tool. The system controller can determine the correct process recipe for the substrate(s) and resume the substrate process without damaging the substrate(s) and fewer substrate processes are performed for additional substrates (e.g., to replace damaged substrates) at the manufacturing system. Accordingly, an overall efficiency and throughput of the manufacturing system is increased, and an overall latency of the manufacturing system is decreased.

According to additional aspects of the present disclosure, a system controller (or another computing system) can use spectral data collected for substrates (e.g., conditioning substrates) to determine a condition of a process chamber during an initialization process and/or a maintenance process. The system controller can further determine, based on the determined condition, whether the initialization process and/or maintenance process is complete or whether operations of such process are to be updated to cause the condition of the process chamber to correspond to a target condition. As indicated above, the spectral data can be collected by the substrate measurement subsystem without the substrates being removed from the process tool (e.g., for measurement by external metrology equipment). By using the spectral data to determine the condition of the process chamber, the system controller can determine the condition of the process chamber in less time and/or after the performance of fewer conditioning operations. Accordingly, a G2G time for the process chamber is reduced, which increases an overall efficiency and decreases an overall latency of the manufacturing system.

FIG. 1 depicts an illustrative computer system architecture 100, according to aspects of the present disclosure. In some embodiments, computer system architecture 100 may be included as part of a manufacturing system for processing substrates, such as manufacturing system 200 of FIG. 2. Computer system architecture 100 includes a client device 120, manufacturing equipment 124, metrology equipment 128, server machine 130, a predictive server 112 (e.g., to generate predictive data, to provide model adaptation, to use a knowledge base, etc.), and/or a data store 140. The predictive server 112 may be part of a predictive system 110. The predictive system 110 may further include server machines 170 and 180. The manufacturing equipment 124 may include sensors 125 configured to capture data for a substrate being processed at the manufacturing system. In some embodiments, the manufacturing equipment 124 and sensors 126 may be part of a sensor system that includes a sensor server (e.g., field service server (FSS) at a manufacturing facility) and sensor identifier reader (e.g., front opening unified pod (FOUP) radio frequency identification (RFID) reader for sensor system). In some embodiments, metrology equipment 128 may be part of a metrology system that includes a metrology server (e.g., a metrology database, metrology folders, etc.) and metrology identifier reader (e.g., FOUP RFID reader for metrology system).

Manufacturing equipment 124 may produce products (e.g., electrical devices) following a recipe or performing runs over a period of time. In some embodiments, manufacturing equipment 124 can include one or more process chambers that process substrates (e.g., production substrates) according to a process recipe. In other or similar embodiments, the process chambers of manufacturing equipment 124 can perform an initialization process and/or a maintenance process, which involve performing one or more conditioning operations (e.g., using one or more conditioning substrates) to bring a process chamber to a condition that is suitable to process production substrates. Manufacturing equipment 124 may include a substrate measurement subsystem that includes one or more sensors 126 configured to generate spectral data and/or positional data for a substrate embedded within the substrate measurement subsystem. Sensors 126 that are configured to generate spectral data (herein referred to as spectra sensing components) may include reflectometry sensors, ellipsometry sensors, thermal spectra sensors, capacitive sensors, and so forth. In some embodiments, spectra sensing components may be included within the substrate measurement subsystem or another portion of the manufacturing system. One or more sensors 126 (e.g., eddy current sensors, etc.) may also be configured to generate non-spectral data for the substrate. Further details regarding manufacturing equipment 124 and the substrate measurement subsystem are provided with respect to FIG. 2 and FIG. 3.

In some embodiments, sensors 126 may provide sensor data associated with manufacturing equipment 124. Sensor data may include a value of one or more of temperature (e.g., heater temperature), spacing (SP), pressure, high frequency radio frequency (HFRF), voltage of electrostatic chuck (ESC), electrical current, flow, power, voltage, etc. Sensor data may be associated with or indicative of manufacturing parameters such as hardware parameters, such as settings or components (e.g., size, type, etc.) of the manufacturing equipment 124, or process parameters of the manufacturing equipment 124. The sensor data may be collected while the manufacturing equipment 124 is performing manufacturing processes (e.g., equipment readings when processing products). The sensor data may be different for each substrate.

Metrology equipment 128 may provide metrology data associated with substrates (e.g., wafers, etc.) processed by manufacturing equipment 124. The metrology data may include a value of one or more of film property data (e.g., wafer spatial film properties), dimensions (e.g., thickness, height, etc.), dielectric constant, dopant concentration, density, defects, etc. In some embodiments, the metrology data may further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data may be of a finished or semi-finished product. The metrology data may be different for each substrate.

The client device 120 may include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, the metrology data may be received from the client device 120. Client device 120 can display a graphical user interface (GUI), where the GUI enables the user to provide, as input, metrology measurement values for substrates processed at the manufacturing system.

Data store 140 may be a memory (e.g., random access memory), a drive (e.g., a hard drive, a flash drive), a database system, or another type of component or device capable of storing data. Data store 140 may include multiple storage components (e.g., multiple drives or multiple databases) that may span multiple computing devices (e.g., multiple server computers). The data store 140 may store spectral data, non-spectral data, metrology data, and predictive data. Spectral data may include historical spectral data (e.g., spectral data generated for a previous substrate processed at the manufacturing system) and/or current spectra (spectral data generated for a current substrate being processed at the manufacturing system. Current spectral data may be data for which predictive data is generated. Although embodiments of the present disclosure reference spectral data for training a machine learning model, it should be noted that embodiments of the present disclosure can also include non-spectral data used to train the machine learning model. In some embodiments, metrology data can include historical metrology data (e.g., metrology measurement values for a prior substrate processed at the manufacturing system). The data store 140 may also store contextual data associated with a substrate being processed at the manufacturing system (e.g., recipe name, recipe step number, preventive maintenance indicator, operator, etc.).

In some embodiments, data store 140 may be configured to store data that is not accessible to a user of the manufacturing system. For example, spectral data, non-spectral data, and/or positional data obtained for a substrate being processed at the manufacturing system may not be accessible to a user of the manufacturing system. In some embodiments, all data stored at data store 140 may be inaccessible by a user (e.g., an operator) of the manufacturing system. In other or similar embodiments, a portion of data stored at data store 140 may be inaccessible by the user while another portion of data stored at data store 140 may be accessible by the user. In some embodiments, one or more portions of data stored at data store 140 may be encrypted using an encryption mechanism that is unknown to the user (e.g., data is encrypted using a private encryption key). In other or similar embodiments, data store 140 may include multiple data stores where data that is inaccessible to the user is stored in one or more first data stores and data that is accessible to the user is stored in one or more second data stores.

As illustrated in FIG. 1, data store 140 can store data associated with a spectral library 142, in some embodiments. The spectral library 142 can include one or more sets of spectral data collected for a substrate before, during, or after the performance of one or more operations for the substrate at manufacturing equipment 124. Spectral data can be collected for the substrate by a substrate measurement subsystem, as described herein, and/or by other sensors 126 of manufacturing equipment 124, in some embodiments. In an illustrative example, spectral library 142 can include one or more sets of spectral data collected before, during, or after the performance of a substrate process for a substrate (e.g., a production substrate) at one or more process chambers of manufacturing equipment 124. In another illustrative example, spectral library 142 can include one or more sets of spectral data collected before, during, or after the performance of an initialization process and/or a maintenance process (e.g., a PM process, a CM process, etc.) performed for a process chamber of manufacturing equipment 124. In some embodiments, spectral library 142 can include additional data associated with a substrate for which spectral data was collected and/or a process recipe and/or manufacturing equipment 124 used to process such substrate. For example, for a respective set of spectral data collected for a substrate, spectral library 142 can include an indication of an identifier associated with the substrate, a type associated with the substrate, a process recipe associated with the substrate, one or more operations of the process recipe that were performed for the substrate, an identifier for a process chamber that processed the substrate (e.g., according to the one or more operations), a type associated with the process chamber, one or more settings associated with the process chamber (e.g., before, after, or during performance of the one or more operations), a date and/or time when the process recipe was performed for the substrate, metrology data collected for the substrate after performance of the one or more operations, a condition of the process chamber before, during, or after performance of the one or more operations, and so forth. In other or similar embodiments, the additional data associated with a substrate can be stored at another region of data store 140 (e.g., separate from spectral library 142).

In some embodiments, system 100 can include one or more server machines 130 that include a spectral data engine 132. In some embodiments, a substrate measurement subsystem that collects spectral data for a substrate can transmit the spectral data to spectral data engine 132 (e.g., via network 108). Spectral data engine 132 can, in some embodiments, generate a mapping between the spectral data collected for a respective substrate and additional data associated with the substrate and/or a process recipe and/or manufacturing equipment 124, as described above. Spectral data engine 132 can store an indication of the mapping at data store 140 (e.g., with spectral library 142 and/or at another region of data store 140). In some embodiments, spectral data engine 132 can provide spectral data received from the substrate measurement subsystem to predictive component 114 (e.g., via network 108). Predictive component 114 can provide the spectral data as input to a trained machine learning model 190, as described herein, in some embodiments. It should be noted that although FIG. 1 illustrates that spectral data engine 132 resides at server machine 130, spectral data engine 132 can reside at any computing system or component of system 100. For example, one or more portions of spectral data engine 132 can be included with predictive component 114, in some embodiments. In another example, one or more portions of spectral data engine 132 can included with a system controller for the manufacturing system of system 100 (e.g., system controller 228 of FIG. 2). In yet another example, one or more portions of spectral data engine 132 can reside at client device 120.

In some embodiments, predictive system 110 includes server machine 170 and server machine 180. Server machine 170 includes a training set generator 172 that is capable of generating training data sets (e.g., a set of data inputs and a set of target outputs) to train, validate, and/or test a machine learning model 190. In some embodiments, the training set generator 172 may partition the training data into a training set, a validating set, and a testing set. In some embodiments, the predictive system 110 generates multiple sets of training data. For example, a first set of training data may correspond to a first type of spectral data (e.g., reflectometry spectral data) and a second set of training data may correspond to a second type of spectral data (ellipsometry spectral data). In some embodiments, training set generator 172 can generate training data based on data of spectral library 142, in accordance with embodiments described herein.

Server machine 180 may include a training engine 182, a validation engine 184, a selection engine 185, and/or a testing engine 186. An engine may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 may be capable of training a machine learning model 190. The machine learning model 190 may refer to the model artifact that is created by the training engine 182 using the training data that includes training inputs and corresponding target outputs (correct answers for respective training inputs). The training engine 182 may find patterns in the training data that map the training input to the target output (the answer to be predicted) and provide the machine learning model 190 that captures these patterns. The machine learning model 190 may use one or more of support vector machine (SVM), Radial Basis Function (RBF), clustering, supervised machine learning, semi-supervised machine learning, unsupervised machine learning, k-nearest neighbor algorithm (k-NN), linear regression, random forest, neural network (e.g., artificial neural network), etc.

The validation engine 184 may be capable of validating a trained machine learning model 190 using a corresponding set of features of a validation set from training set generator 172. The validation engine 184 may determine an accuracy of each of the trained machine learning models 190 based on the corresponding sets of features of the validation set. The validation engine 184 may discard a trained machine learning model 190 that has an accuracy that does not meet a threshold accuracy. In some embodiments, the selection engine 185 may be capable of selecting a trained machine learning model 190 that has an accuracy that meets a threshold accuracy. In some embodiments, the selection engine 185 may be capable of selecting the trained machine learning model 190 that has the highest accuracy of the trained machine learning models 190.

The testing engine 186 may be capable of testing a trained machine learning model 190 using a corresponding set of features of a testing set from training set generator 172. For example, a first trained machine learning model 190 that was trained using a first set of features of the training set may be tested using the first set of features of the testing set. The testing engine 186 may determine a trained machine learning model 190 that has the highest accuracy of all of the trained machine learning models based on the testing sets.

Predictive server 112 includes a predictive component 114 that is capable of providing spectral data and/or non-spectral data for a portion of a current substrate being processed at a manufacturing system as input to trained machine learning model 190 and running trained machine learning model 190 on the input to obtain one or more outputs. In some embodiments, machine learning model 190 can be trained to predict, based on given spectral data, a respective process recipe associated with one or more substrates at a manufacturing system and one or more operations of the respective process recipe that have already been performed for the one or more substrates. In such embodiments, predictive component 114 can provide spectral data associated with a substrate as input to trained model 190 and obtain one or more outputs of model 190. The one or more outputs can indicate a process recipe associated with the substrate and one or more operations of the process recipe that have already been performed for the substrate. In additional or alternative embodiments, machine learning model 190 can be trained to predict, based on given spectral data for a respective substrate (e.g., a conditioning substrate), a condition of a respective process chamber of the manufacturing system that processed the substrate. In such embodiments, predictive component 114 can provide spectral data collected for a conditioning substrate as input to trained model 190 and obtain one or more outputs of model 190. The one or more outputs can indicate a condition of the process chamber that processed the conditioning substrate. Further details regarding training and using model 190 are provided herein.

The client device 120, manufacturing equipment 124, sensors 126, metrology equipment 128, predictive server 112, server machine(s) 130, data store 140, server machine 170, and server machine 180 may be coupled to each other via a network 108. In some embodiments, network 108 is a public network that provides client device 120 with access to predictive server 112, data store 140, and other publicly available computing devices. In some embodiments, network 108 is a private network that provides client device 120 access to manufacturing equipment 124, metrology equipment 128, data store 140, and other privately available computing devices. Network 108 may include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of server machines 130, 170 and 180, as well as predictive server 112, may be provided by a fewer number of machines. For example, in some embodiments, server machines 130, 170 and 180 may be integrated into a single machine, while in some other or similar embodiments, server machines 130, 170 and 180, as well as predictive server 112, may be integrated into a single machine.

In general, functions described in one implementation as being performed by server machine 130, server machine 170, server machine 180, and/or predictive server 112 can also be performed on client device 120. In addition, the functionality attributed to a particular component can be performed by different or multiple components operating together.

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Figure 2:
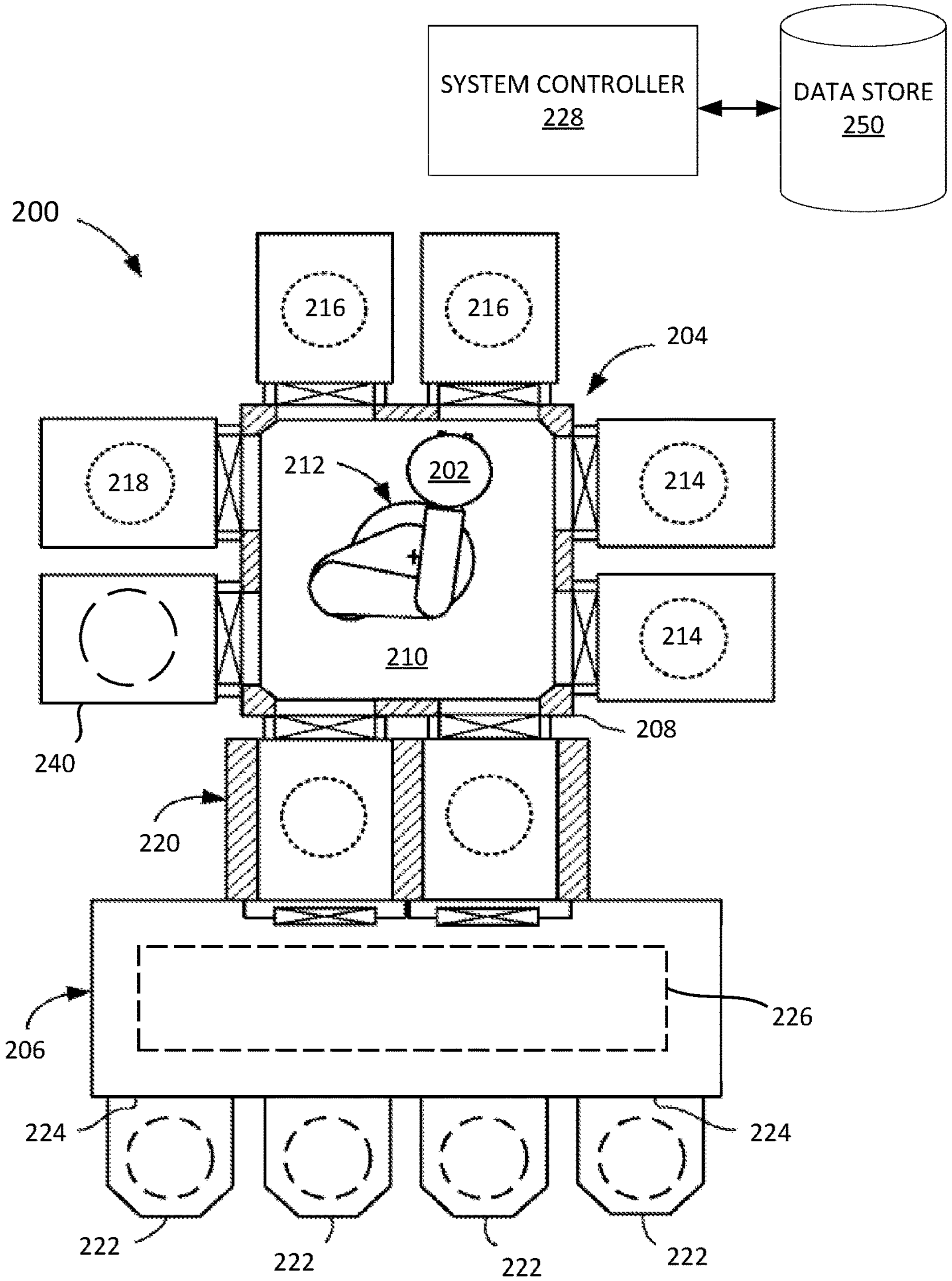
FIG. 2 is a top schematic view of an example manufacturing system, according to aspects of the present disclosure.

FIG. 2 is a top schematic view of an example manufacturing system 200, according to aspects of the present disclosure. Manufacturing system 200 may perform one or more processes on a substrate 202. Substrate 202 may be any suitably rigid, fixed-dimension, planar article, such as, e.g., a silicon-containing disc or wafer, a patterned wafer, a glass plate, or the like, suitable for fabricating electronic devices or circuit components thereon. In some embodiments, substrate 202 can be a production substrate (e.g., a substrate used for production of a product, such as an electronic device), a conditioning substrate (e.g., a substrate used during performance of one or more conditioning operations, such as an initialization process and/or a maintenance process), and/or any other type of substrate.

Manufacturing system 200 may include a process tool 204 and a factory interface 206 coupled to process tool 204.

Process tool 204 may include a housing 208 having a transfer chamber 210 therein. Transfer chamber 210 may include one or more process chambers (also referred to as process chambers) 214, 216, 218 disposed therearound and coupled thereto. Process chambers 214, 216, 218 may be coupled to transfer chamber 210 through respective ports, such as slit valves or the like. Transfer chamber 210 may also include a transfer chamber robot 212 configured to transfer substrate 202 between process chambers 214, 216, 218, load lock 220, etc. Transfer chamber robot 212 may include one or multiple arms where each arm includes one or more end effectors at the end of each arm. The end effector may be configured to handle particular objects, such as wafers.

Process chambers 214, 216, 218 may be adapted to carry out any number of processes on substrates 202. A same or different substrate process may take place in each process chamber 214, 216, 218. In some embodiments, process chamber 214, 216, 218 can perform a substrate process for one or more substrates 202. A substrate process may include atomic layer deposition (ALD), physical vapor deposition (PVD), chemical vapor deposition (CVD), etching, annealing, curing, pre-cleaning, metal or metal oxide removal, or the like. In some embodiments, a substrate process may include a combination of two or more of atomic layer deposition (ALD), physical vapor deposition (PVD), chemical vapor deposition (CVD), etching, annealing, curing, pre-cleaning, metal or metal oxide removal, or the like. Other processes may be carried out on substrates therein. For example, an initialization process can be performed at one or more of process chambers 214, 216, 218 to prepare process chambers 214, 216, 218 for a substrate process. In another example, a maintenance process (e.g., a PM process, a CM process, etc.) can be performed to mitigate and/or correct wear or damage to components and/or an interior of process chambers 214, 216, 218. Process chambers 214, 216, 218 may each include one or more sensors configured to capture data for substrate 202 and/or an environment within process chamber 214, 216, 218, before, after, or during a substrate process. In some embodiments, the one or more sensors may be configured to capture spectral data and/or non-spectral data for a portion of substrate 202.

A load lock 220 may also be coupled to housing 208 and transfer chamber 210. Load lock 220 may be configured to interface with, and be coupled to, transfer chamber 210 on one side and factory interface 206. Load lock 220 may have an environmentally controlled atmosphere that may be changed from a vacuum environment (wherein substrates may be transferred to and from transfer chamber 210) to an inert-gas environment at or near atmospheric-pressure (wherein substrates may be transferred to and from factory interface 206) in some embodiments.

Factory interface 206 may be any suitable enclosure, such as, e.g., an Equipment Front End Module (EFEM). Factory interface 206 may be configured to receive substrates 202 from substrate carriers 222 (e.g., Front Opening Unified Pods (FOUPs)) docked at various load ports of factory interface 206. A factory interface robot 226 (shown dotted) may be configured to transfer substrates 202 between substrate carriers (also referred to as containers) 222 and load lock 220. In other and/or similar embodiments, factory interface 206 may be configured to receive replacement parts from replacement parts storage containers 222.

Manufacturing system 200 may also be connected to a client device (not shown) that is configured to provide information regarding manufacturing system 200 to a user (e.g., an operator). In some embodiments, the client device may provide information to a user of manufacturing system 200 via one or more graphical user interfaces (GUIs). For example, the client device may provide information regarding one or more modifications to be made to a process recipe for a substrate 202 via a GUI.

Manufacturing system 200 may also include a system controller 228. System controller 228 may be and/or include a computing device such as a personal computer, a server computer, a programmable logic controller (PLC), a microcontroller, and so on. System controller 228 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. System controller 228 may include a data storage device (e.g., one or more disk drives and/or solid state drives), a main memory, a static memory, a network interface, and/or other components. System controller 228 may execute instructions to perform any one or more of the methodologies and/or embodiments described herein. In some embodiments, system controller 228 may execute instructions to perform one or more operations at manufacturing system 200 in accordance with a process recipe. The instructions may be stored on a computer readable storage medium, which may include the main memory, static memory, secondary storage and/or processing device (during execution of the instructions).

System controller 228 may receive data from sensors included on or within various portions of manufacturing system 200 (e.g., process chambers 214, 216, 218, transfer chamber 210, load lock 220, etc.). Data received by the system controller 228 may include spectral data and/or non-spectral data for a portion of substrate 202. For purposes of the present description, system controller 228 is described as receiving data from sensors included within process chambers 214, 216, 218. However, system controller 228 may receive data from any portion of manufacturing system 200 and may use data received from the portion in accordance with embodiments described herein. In an illustrative example, system controller 228 may receive spectral data from one or more sensors for process chamber 214, 216, 218 before, after, or during a substrate process at the process chamber 214, 216, 218. Data received from sensors of the various portions of manufacturing system 200 may be stored in a data store 250. Data store 250 may be included as a component within system controller 228 or may be a separate component from system controller 228. In some embodiments, data store 250 may be data store 140 described with respect to FIG. 1.

Manufacturing system 200 may further include a substrate measurement subsystem 240. Substrate measurement subsystem 240 may obtain spectra measurements for one or more portions of a substrate 202 before, during, or after the substrate 202 is processed at manufacturing system 200. In some embodiments, substrate measurement subsystem 240 may obtain spectral measurements for one or more portions of substrate 202 in response to receiving a request for the spectra measurements from system controller 228. Substrate measurement subsystem 240 may be integrated within a portion of manufacturing system 200. In some embodiments, substrate measurement subsystem 240 may be integrated with transfer chamber 210, as illustrated in FIG. 2. In other or similar embodiments, substrate measurement subsystem 240 may be integrated within factory interface 206. In yet other or similar embodiments, substrate measurement subsystem 240 may be integrated within one or more of process chambers 214, 216, and/or 218. For example, one or more components of substrate measurement subsystem 240 can be included within an interior environment of process chambers 214, 216, and/or 218, In another example, a process chamber 214, 216, 218 can include a window (e.g., in a lid of the process chamber, in a side wall of the process chamber, etc.) that optically exposes the interior environment of process chamber 214, 216, 218 to an exterior environment of process chamber 214, 216, 218. Substrate measurement subsystem 240 can be disposed outside of process chamber process chamber 214, 216, 218 and configured to collect spectral data for a substrate while the substrate is within process chamber 214, 216, 218. In yet other or similar embodiments, substrate measurement subsystem 240 may not be integrated with any portion of manufacturing system 200 and instead may be a stand-alone component. In such embodiments, a substrate 202 measured at substrate measurement subsystem 240 may be transferred to and from a portion of manufacturing system 200 prior to or after the substrate 202 is processed at manufacturing system 200.

Substrate measurement subsystem 240 may obtain spectra measurements for a portion of substrate 202 by generating spectral data and/or non-spectral data for the portion of substrate 202. In some embodiments, substrate measurement subsystem 240 is configured to generate spectral data, non-spectral data, positional data, and other substrate property data for substrate 202 (e.g., a thickness of substrate 202, a width of substrate 202, etc.). After generating data for substrate 202, substrate measurement subsystem 240 may transmit the generated data to system controller 228. Responsive to receiving data from substrate measurement subsystem 240, system controller 228 may store the data at data store 250. In other or similar embodiments, substrate measurement subsystem 240 and/or system controller 228 can provide the data to spectral data engine 132. As described above, one or more portions of spectral data engine 132 can reside at system controller 228, in some embodiments.

Figure 3:
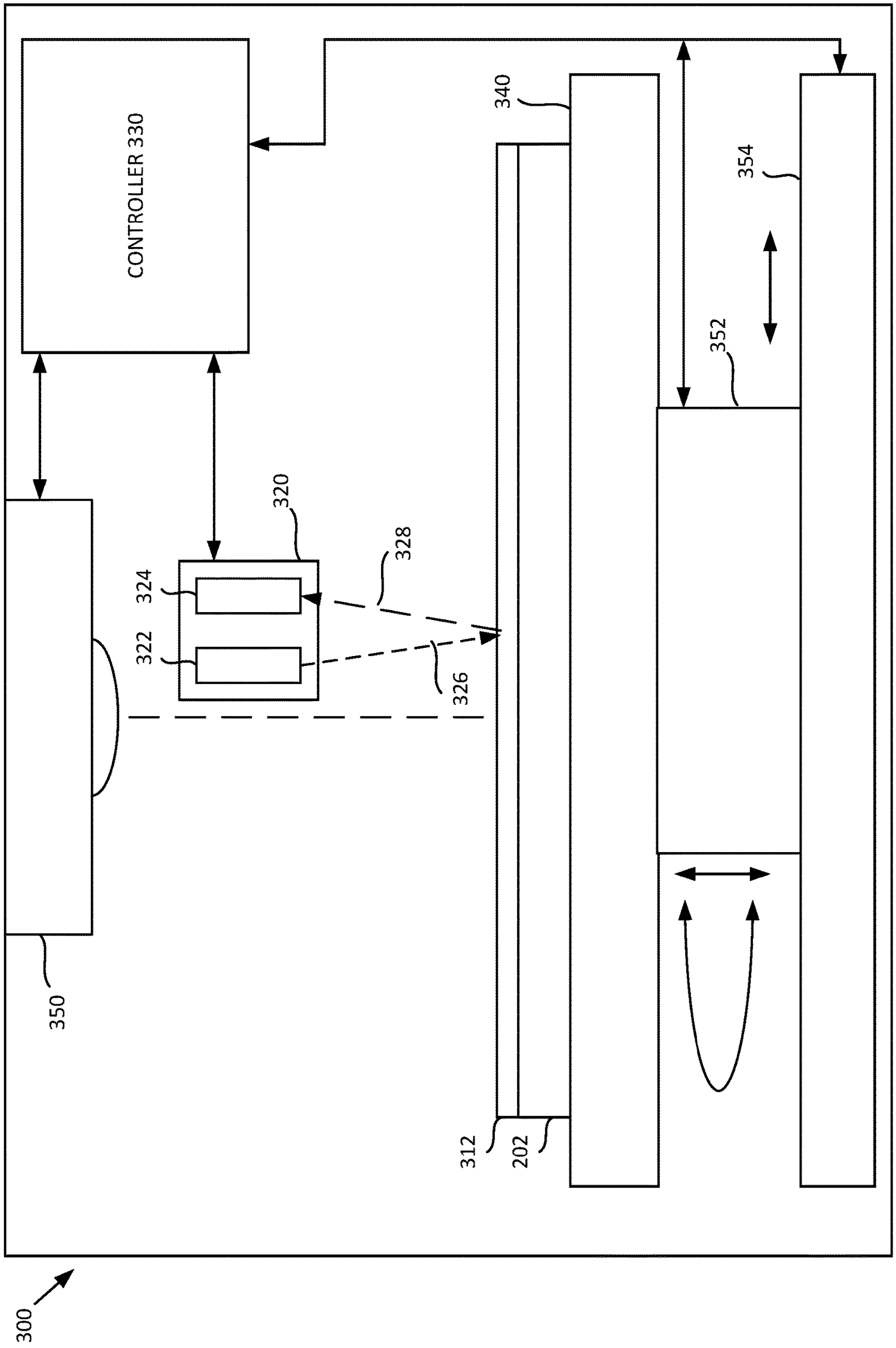
FIG. 3 is a cross-sectional schematic side view of a substrate measurement subsystem, according to aspects of the present disclosure.

FIG. 3 is a cross-sectional schematic side view of a substrate measurement subsystem 300, according to aspects of the present disclosure. Substrate measurement subsystem 300 can be the same as or can otherwise correspond to substrate measurement subsystem 240 of FIG. 2. Substrate measurement subsystem 300 may be configured to obtain measurements for one or more portions of a substrate, such as substrate 202 of FIG. 2, prior to, during, or after processing of substrate 202 at a process chamber (e.g., process chamber 214, 216, 218). Substrate measurement subsystem 300 may obtain spectral measurements for a portion of substrate 202 by generating data (e.g., spectral data, non-spectral data, etc.) associated with the portion of substrate 202. In some embodiments, substrate measurement subsystem 300 may be configured to generate spectral data, non-spectral data, positional data, and/or other property data associated with substrate 202. Substrate measurement subsystem 300 may include a controller 330 configured to execute one or more instructions for generating data associated with a portion of substrate 202.

Substrate measurement subsystem 300 may detect that substrate 202 has been transferred to substrate measurement subsystem 300. Responsive to detecting that substrate 202 has been transferred to substrate measurement subsystem 300, substrate measurement subsystem 300 may determine a position and/or an orientation of substrate 202. The position and/or orientation of substrate 202 may be determined based on an identification of a reference location of substrate 202. A reference location may be a portion of substrate 202 that includes an identifying feature that is associated with a specific portion of substrate 202. Controller 228 may determine an identifying feature associated with a specific portion of substrate 202 based on determined identifying information for substrate 202.

Controller 330 may identify the reference location for substrate 202 using one or more camera components 350 configured to capture image data for substrate 202. Camera components 350 may generate image data for with one or more portions of the substrate 202 and transmit the image data to controller 330. Controller 330 may analyze the image data to identify an identifying feature associated with a reference location for substrate 202. Controller 330 may further determine a position and/or orientation of substrate 202 as depicted in the image data based on the identified identifying feature of substrate 202. Controller 330 may determine a position and/or orientation of substrate 202 based on the identified identifying feature of substrate 202 and the determined position and/or orientation of substrate 202 as depicted in the image data. Responsive to determining the position and/or orientation of substrate 202, controller 330 may generate positional data associated with one or more portions of substrate 202. In some embodiments, the positional data may include one or more coordinates (e.g., Cartesian coordinates, polar coordinates, etc.) each associated with a portion of substrate 202, where each coordinate is determined based on a distance from the reference location for substrate 202.

Substrate measurement subsystem 300 may include one or more measurement components for measuring substrate 202. In some embodiments, substrate measurement subsystem 300 may include one or more spectra sensing components 320 configured to generate spectral data for one or more portions of substrate 202. As discussed previously, spectral data may correspond to an intensity (i.e., a strength or amount of energy) of a detected wave of energy for each wavelength of the detected wave.

A spectra sensing component 320 may be configured to detect waves of energy reflected from a portion of substrate 202 and generate spectral data associated with the detected waves. Spectra sensing component 320 may include a wave generator 322 and a reflected wave receiver 324. In some embodiments, wave generator 322 may be a light wave generator configured to generate a beam of light towards a portion of substrate 202. In such embodiments, reflected wave receiver 324 may be configured to receive a reflected light beam from the portion of substrate 202. Wave generator 322 may be configured to generate an energy stream 326 (e.g., a light beam) and transmit energy stream 326 to a portion of substrate 202. A reflected energy wave 328 may be reflected from the portion of substrate 202 and received by reflected wave receiver 324.

Responsive to reflected wave receiver 324 receiving reflected energy wave 328 from the portion of substrate 202, spectra sensing component 320 may measure a wavelength of each wave included in reflected energy wave 328. Spectra sensing component 320 may further measure an intensity of each measured wavelength. Responsive to measuring each wavelength and each wavelength intensity, spectra sensing component 320 may generate spectral data for the portion of substrate 202. Spectra sensing component 320 may transmit the generated spectral data to controller 330. Controller 330 may, responsive to receiving the generated spectral data, generate a mapping between the received spectral data and positional data for the measured portion of substrate 202.

Substrate measurement subsystem 300 may be configured to generate a specific type of spectral data based on a type of measurement to be obtained at substrate measurement subsystem 300. In some embodiments, spectra sensing component 420 may be a first spectra sensing component that is configured to generate one type of spectral data. For example, spectra sensing component 320 may be configured to generate reflectometry spectral data, ellipsometry spectral data, hyperspectral imaging data, chemical imaging data, thermal spectral data, or conductive spectral data. In such embodiments, the first spectra sensing component may be removed from substrate measurement subsystem 300 and replaced with a second spectra sensing component configured to generate a different type of spectral data (e.g., reflectometry spectral data, ellipsometry spectral data, hyperspectral imaging data, chemical imaging data, eddy current spectral data, thermal spectral data, or conductive spectral data).

In some embodiments, substrate measurement subsystem 300 can include a substrate holder 340. Substrate holder 340 can be a chuck such as a vacuum chuck, an electrostatic chuck, a magnetic chuck, a mechanical chuck (e.g., a four jaw chuck, a three jaw chuck, an edge/ring clamp chuck, etc.) or other type of chuck. Substrate holder 340 may also be or include a plate or other surface with a substrate-shaped pocket and/or a set of pins or other features (e.g., three pins) that surround the substrate and keep the substrate from shifting relative to the substrate holder 340 during movement of the substrate holder 340. Substrate holder 340 may secure a substrate 202. In one embodiment, the substrate holder 340 includes an edge clamp that clamps the substrate from the edges. In one embodiment, substrate holder 340 is a vacuum chuck. In other embodiments, substrate holder 340 may be a different type of chuck such as an electrostatic chuck, a mechanical chuck, a magnetic chuck, or the like.

Substrate measurement subsystem can include one or more positional components configured to modify a position and/or orientation of substrate 202 with respect to spectra sensing component 320. In some embodiments, the positional components can include a first actuator 352, which can move substrate holder 340 about a first axis (e.g., a rotational axis) and/or a second axis (e.g., a vertical axis). In some embodiments, first actuator 352 can be controlled by a servo controller and/or a servomotor, which may allow for precise control of a rotational position, linear position, velocity, and/or acceleration of first actuator 352 and thus substrate holder 340. Substrate holder 340 may have a mass between 1.0 kilograms (kg) and 2.0 kg, which allows for linear and/or rotational accelerations between 6000 deg/sec$^2$ and 14000 deg/sec$^2$. In additional or alternative embodiments, the positional components can include a second actuator 354, which can move substrate holder 340 along a second axis (e.g., a horizontal axis). Second actuator 354 can be controlled by a servo controller and/or a servomotor, in some embodiments, which may allow for precise control of a linear position, velocity, and/or acceleration of second actuator 354, and thus of substrate holder 340.

As spectra sensing component 320 generates spectral data for one or more portions of substrate 202, the one or more positional components may modify the position and/or orientation of substrate 202 in accordance with the one or more determined portions to be measured for substrate 202. For example, prior to spectra sensing component 320 generating spectral data for substrate 202, the positional component(s) may position substrate 202 at Cartesian coordinate (0,0) and spectra sensing component 320 may generate first spectral data for substrate 202 at Cartesian coordinate (0,0). Responsive to spectra sensing component 320 generating first spectral data for substrate 202 at Cartesian coordinate (0,0), second actuator 354 may translate substrate 202 along the horizontal axis so that spectra sensing component 320 is configured to generate second spectral data for substrate 202 at Cartesian coordinate (0,1). Responsive to spectra sensing component 320 generating second spectral data for substrate 202 at Cartesian coordinate (0,1), the first actuator 352 may rotate substrate 202 along the first axis so that spectra sensing component 320 is configured to generate third spectral data for substrate 202 at Cartesian coordinate (1,1). This process may occur multiple times until spectral data is generated for each determined portion of substrate 202.

In some embodiments, one or more layers 312 of material may be included on a surface of substrate 202. The one or more layers 312 may include etch material, photoresist material, mask material, deposited material, etc. In some embodiments, the one or more layers 312 may include an etch material to be etched according to an etch processed performed at a process chamber. In such embodiments, spectral data may be collected for one or more portions of the un-etched etch material of the layer 312 deposited on substrate 202, in accordance with previously disclosed embodiments. In other or similar embodiments, the one or more layers 312 may include an etch material that has already been etched according an etch process at the process chamber. In such embodiments, one or more structural features (e.g., lines, columns, openings, etc.) may be etched into the one or more layers 312 of substrate 202. In such embodiments, spectral data may be collected for one or more structural features etched into the one or more layers 312 of substrate 202.

Responsive to receiving at least one of the spectral data, the positional data, or the property data for the substrate 202, controller 330 may transmit the received data to system controller 228 for processing and analysis, in accordance with embodiment described herein.

As indicated above, one or more components of substrate measurement subsystem 300 can be included in a process chamber 214, 216, 218 and/or otherwise configured to collect spectral data for a substrate within the process chamber 214, 216, 218. In one illustrative example, a process chamber (e.g., process chamber 214) can include a substrate support assembly that is configured to support a substrate 202 during a process (e.g., a substrate process, etc.). Camera components 350 and/or spectra sensing component 320 can be included within the process chamber 214 and can generate spectral data and/or non-spectral data for substrate 202 before, during or after the process, as described herein. Camera component 350 and/or spectra sensing component 320 can transmit the generated measurements to controller 330, which may be located outside of the process chamber. Controller 330 can transmit the generated measurements to system controller 228 and/or to spectral data engine 132, as described herein. In another illustrative example, a transparent window can be embedded within one or more surfaces of process chamber 214 (e.g., a lid, an exterior wall, etc.). Camera component 350 and/or spectra sensing component 320 can be configured to generate spectra data by detecting spectra from outside of the process chamber 214 through the transparent window, in some embodiments. It should be noted that camera component 350, spectra sensing component 320 and/or any other component of substrate measurement subsystem 300 can be configured to generate spectral data and/or non-spectral data for a substrate 202 within or outside of a process chamber 214, 216, 218 according to any orientation, according to embodiments described herein.

Referring back to FIG. 1, in some embodiments, spectral data engine 132 can include or can otherwise be connected to a process identifier engine and/or a chamber conditioning engine. In some embodiments, system controller 228 can lose track of one or more substrates (e.g., production substrates) at process tool 204. The process identifier engine can be configured to determine a process recipe associated with a substrate and/or one or more operations of the process recipe that have been performed for the substrate based on spectral data collected for the substrate (e.g., by substrate measurement subsystem 300). In additional or alternative embodiments, chamber conditioning operations of an initialization process and/or a maintenance process (e.g., a PM process, a CM process, etc.) can be performed at a process chamber 214, 216, 218 using one or more chamber conditioning substrates. The chamber conditioning engine can determine, based on spectral data collected for the chamber conditioning substrate(s), whether a condition of the process chamber 214, 216, 218 meets one or more chamber condition criteria. If so, system controller 228 can initiate one or more substrate processes at the process chamber 214, 216, 218 using one or more production substrates. If not, system controller can update the initialization process and/or the maintenance process to cause the chamber of process chamber 214, 216, 218 to satisfy the chamber condition criteria. Further details regarding the process identifier engine and the chamber conditioning engine are described herein with respect to FIGS. 4-9.

Figure 4:
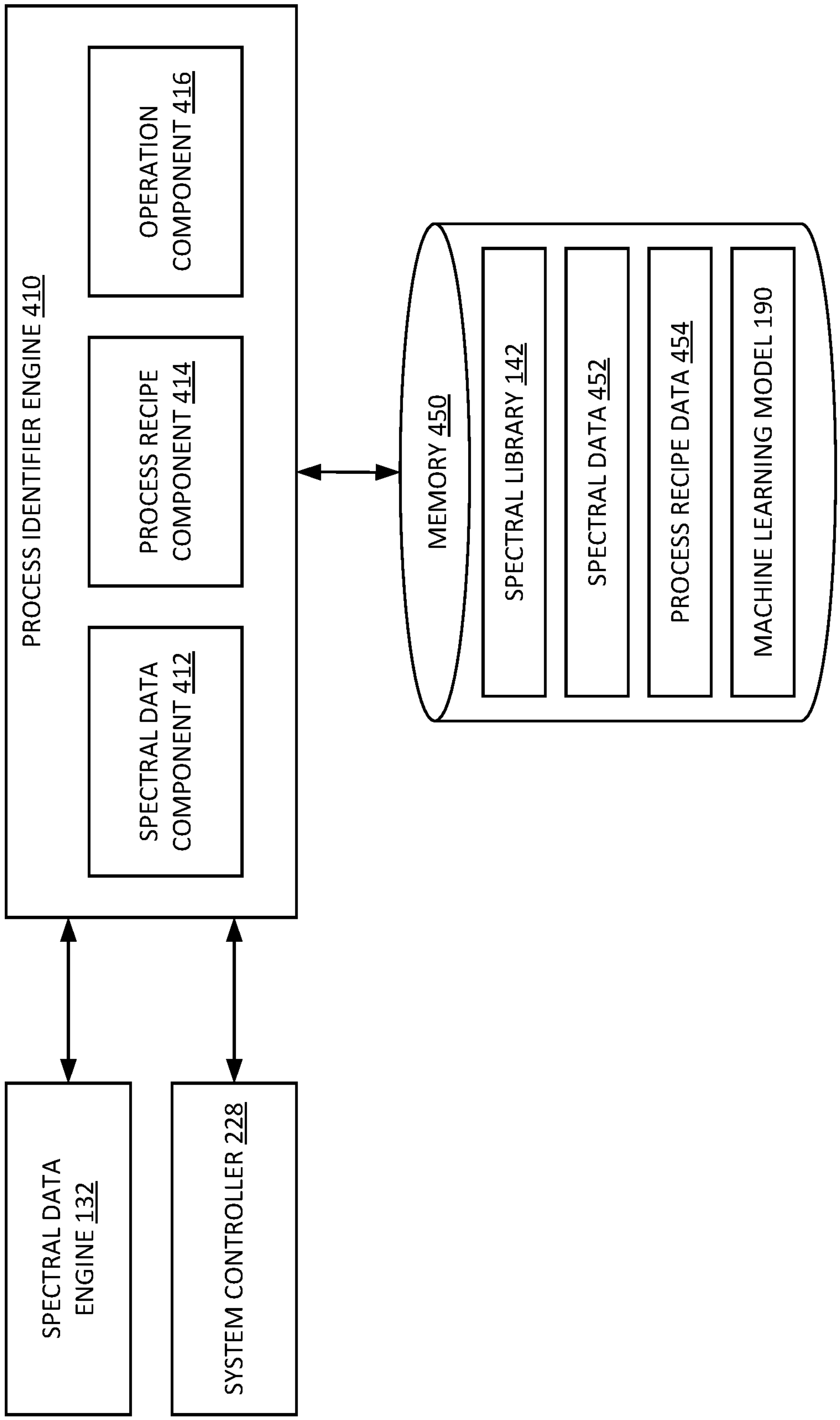
FIG. 4 depicts an example process identifier engine, according to aspects of the present disclosure.

FIG. 4 depicts an example process identifier engine 410, according to aspects of the present disclosure. As described above, process identifier engine 410 can be part of spectral data engine 132, in some embodiments. In other or similar embodiments, process identifier engine 410 can reside at a different computing system than the computing system that runs spectral data engine 132. In such embodiments, process identifier engine 410 can be communicatively coupled to spectral data engine 132 and/or system controller 228 (e.g., via network 108, via a bus, etc.). As illustrated in FIG. 4, process identifier engine 410 can include a spectral data component 412, a process recipe component 414, and/or an operation component 416. Process identifier engine 410, spectral data engine 132, and/or system controller 228 can be coupled to memory 450 (e.g., via network 108, via a bus, etc.). In some embodiments, memory 450 can include one or more regions of data store 140 and/or any other memory of system 100.

Figure 5:
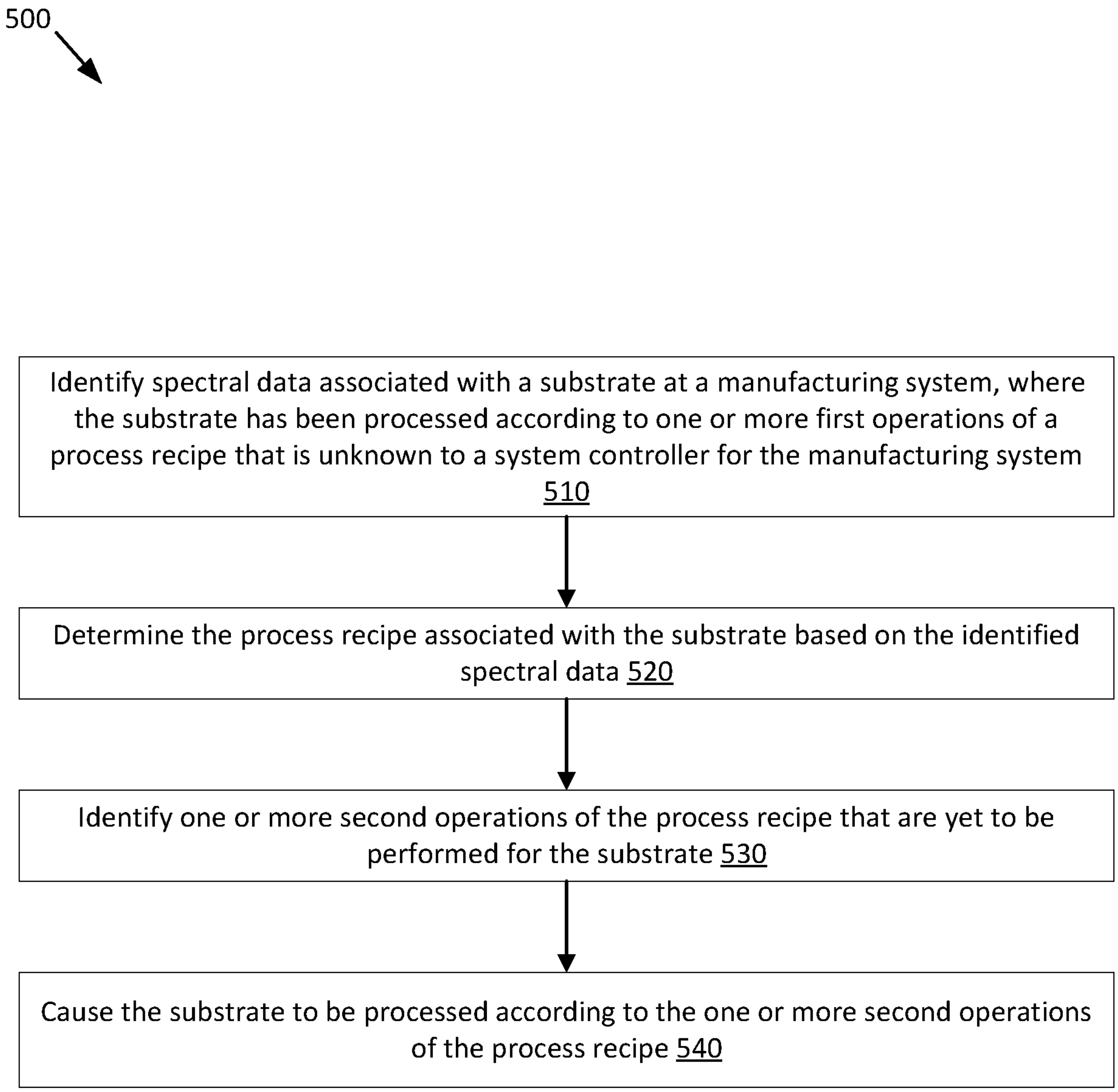
FIG. 5 is a flow chart of an example method for preventing misprocessing of a substrate, according to aspects of the present disclosure.

FIG. 5 is a flow chart of an example method 500 for preventing misprocessing of a substrate, according to aspects of the present disclosure. Method 500 is performed by processing logic that can include hardware (circuitry, dedicated logic, etc.), software (such as is run on a general-purpose computer system or a dedicated machine), firmware, or some combination thereof. In one implementation, method 500 can be performed by a computer system, such as computer system architecture 100 of FIG. 1. In other or similar implementations, one or more operations of method 500 can be performed by one or more other machines not depicted in the figures. In some aspects, one or more operations of method 500 can be performed by process identifier engine 410. In other or similar aspects, one or more operations of method 500 can be performed by system controller 228.

At block 510, process logic identifies spectral data associated with a substrate at a manufacturing system. In some embodiments, the substrate 202 can be a production substrate, as described herein. Substrate 202 may have been processed according to one or more operations of a process recipe (e.g., for a substrate process) at a process chamber 214, 216, 218. For the purposes of explanation and illustration only, embodiments and examples of the present disclosure may be described with respect to process chamber 214. However, embodiments and examples of the present disclosure can be applied to any of process chambers 214, 216, 218 and/or any other process chambers of manufacturing system 200 and/or another manufacturing system (e.g., that does not include process chambers 214, 216, 218). In an illustrative example, substrate 202 may be processed at process chamber 214 according to one or more first operations of a process recipe. Before, during or after the performance of the one or more first operations, system controller 228 may lose track of the substrate 202. For instance, before, during, or after performance of the one or more first operations, process tool 204 and/or system controller 228 may lose power and a state of substrate 202 and/or process chamber 214 may not be stored to memory (e.g., non-volatile memory) before the power is lost. Accordingly, the process recipe associated with substrate 202 and/or the one or more first operations performed for substrate 202 may be unknown to system controller 228.

In some embodiments, the system controller 228 can determine that the process recipe and/or the one or more first operations performed for substrate 202 are unknown to system controller 228 (e.g., by determining that there is no data or information indicating an association of the process recipe for substrate 202 in memory 450). Upon determining that the process recipe and/or the first operation(s) are unknown, system controller 228 can cause substrate measurement subsystem 300 to generate spectral data for one or more regions of substrate 202. As described above, substrate measurement subsystem 300 can be included at or otherwise connected to transfer chamber 210 (e.g., within a vacuum environment), in some embodiments. In such embodiments, system controller 228 can transmit a signal to a motion controller for transfer chamber robot 212 to cause transfer chamber robot 212 to transfer substrate 202 from process chamber 214 to substrate measurement subsystem 300. In other or similar embodiments, substrate measurement subsystem 300 can be included at or otherwise connected to factory interface 206 (e.g., outside of a vacuum environment). In such embodiments, system controller 228 can transmit a first signal to a motion controller for transfer chamber robot 212 to cause transfer chamber robot 212 to transfer substrate 202 from process chamber 214 to load lock 220 and a second signal to a motion controller factory interface robot 226 to cause factory interface robot 226 to transfer substrate 202 from load lock 220 to substrate measurement subsystem 300. In yet other or similar embodiments, one or more components of substrate measurement subsystem 300 can be included at or otherwise configured to collect spectral data and/or non-spectral data for substrate 202 while substrate 202 is at process chamber 214. In such embodiments, substrate 202 remains in process chamber 214 for measurement.

In some embodiments, system controller 228 and/or process identifier engine 410 can transmit a signal to controller 330 to cause substrate measurement subsystem 300 to generate measurements of spectra for one or more regions of a surface of substrate 202. In some embodiments, the signal can include an indication of the regions of the surface of substrate 202 that are to be measured. In other or similar embodiments, the regions of the surface of substrate 202 can be provided to controller 330 prior to initialization of process chamber 214 and/or process tool 204 (e.g., by an operator or engineer of manufacturing system 200, etc.). In some embodiments, controller 330 can cause the one or more positional components to move (e.g., rotate, translate) substrate 202 along one or more axes to a target position. Spectra sensing component(s) 320 and/or camera component(s) 350 can collect spectral data and/or non-spectral data for substrate 202 after substrate 202 is moved to the target position, in some embodiments.

Upon spectra sensing component(s) 320 and/or camera component(s) 350 collecting the spectral and/or non-spectral data for substrate 202, controller 330 can transmit the collected data to process identifier engine 410 (e.g., via network 108, via a bus, etc.). Spectral data component 412 can store the spectral data collected for the substrate 202 at memory 450 (e.g., as spectral data 452), in some embodiments. The spectral data 452 associated with substrate 202 can be identified from the signal provided by controller 330 and/or from memory 450, in some embodiments.

Referring back to FIG. 5, at block 520, process logic determines a process recipe associated with the substrate based on the identified spectral data. In some embodiments, process recipe component 414 of process identifier engine 410 can determine the process recipe associated with substrate 202 by comparing the spectral data 452 collected for substrate 202 with spectral data collected for other substrates and stored at spectral library 142. Spectral data 452 can indicate a state of substrate 202 at the time the spectral data 254 is collected (e.g., after performance of the first operation (s) of the process recipe). Process recipe component 414 can compare spectral data 452 to spectral data of spectral library 142 and can identify a set of spectral data that corresponds to (e.g., matches or substantially matches) spectral data 452. In response to identifying a set of spectral data that corresponds to spectral data 452, process recipe component 414 can determine a substrate associated with the identified set of spectral data and/or a process recipe associated with the substrate for which the set of spectral data was generated (e.g., based on additional data associated with the substrate and/or the process recipe stored at spectral library 142). As described herein, the identified set of spectral data can correspond to a prior substrate processed at a process chamber (e.g., process chamber 214, 216, 218, etc.) according to one or more operations of a prior substrate process. Set of spectral data collected for the prior substrate can indicate a state of the prior substrate after performance of the one or more operations of the process recipe used to process the prior substrate. Process recipe component 414 can store an indication of the process recipe at memory 450 as process recipe data 454.

In some embodiments, a machine learning model (e.g., model 190) can be trained using data of spectral library 142 to predict, based on given spectral data collected for a substrate, a process recipe associated with the substrate and one or more operations of the process recipe that have already been performed for the substrate. Details regarding training model 190 are provided with respect to FIG. 6. In some embodiments, process recipe component 414 can provide spectral data 452 collected for substrate 202 as input to trained machine learning model 190 and obtain one or more outputs of machine learning model 190. The one or more outputs of model 190 can include an indication of one or more process recipes and, for each of the one or more process recipes, an indication of a level of confidence that a respective process recipe is associated with the substrate 202 based on spectral data 452. In additional or alternative embodiments, the one or more outputs of model 190 can include an indication of one or more operations of a respective process recipe and, for each of the one or more operations, a level of confidence that the operation has been performed for substrate 202. Process recipe component 414 can determine a process recipe associated with substrate 202 by identifying a process recipe of the one or more outputs of model 190 having a level of confidence that satisfies one or more confidence criteria (e.g., exceeds a threshold level of confidence, is larger than other levels of confidence associated with other process recipes, etc.).

Referring back to FIG. 5, at block 530, process logic identifies one or more second operations of the process recipe that are yet to be performed for the substrate. As described above, in some embodiments, process recipe component 414 can determine the process recipe associated with substrate 202 by comparing spectral data 452 to spectral data of spectral library 142. As also indicated above, the spectral data of spectral library 142 that corresponds to spectral data 452 can be generated for a prior substrate after performance of one or more operations of a process recipe (e.g., the process recipe that is associated with substrate 202). In some embodiments, spectral library 142 can include a mapping between the set of spectral data and an indication of one or more operations of the process recipe that were performed for the prior substrate. Operation component 416 can determine the one or more operations that were performed for substrate 202 based on the one or more operations performed for the prior substrate, in some embodiments.

In other or similar embodiments, one or more outputs of model 190 can include an indication of one or more operations of a process recipe and, for each of the one or more operations, an indication of a level of confidence that a respective operation has already been performed for substrate 202, in view of spectral data 452 provided as input to model 190. Operation component 416 can determine one or more operations that have already been performed for substrate 202 by identifying the one or more operations having a level of confidence that satisfies one or more confidence criteria (e.g., exceed a threshold level of confidence, is larger than other levels of confidence associated with other operations, etc.).

In some embodiments, the process recipe associated with substrate 202 can include one or more operations. Operation component 416 can identify (e.g., from spectral library 142, from a process recipe library at data store 140, etc.) the set of operations associated with the process recipe and determine, based on the determined operations performed for substrate 202, which operations have not yet been performed for substrate 202.

Referring back to FIG. 5, at block 540, process logic causes the substrate to be processed according to the one or more second operations of the process recipe. In some embodiments, process identifier engine 410 can provide a notification to system controller 228 (e.g., via network 108, via a bus, etc.) that indicates the process recipe associated with substrate 202 and the one or more operations of the process recipe that are yet to be performed. Upon receiving the notification, system controller 228 can initiate performance of the one or more operations, in accordance with embodiments described herein. As described above, substrate 202 may have been transferred to substrate measurement subsystem 300 for collection of the spectral data 452, in some embodiments. In such embodiments, system controller 228 can transmit one or more signals to motion controllers (e.g., for FI robot 226, for transfer chamber robot 212) to cause substrate 202 to be transferred to process chamber 214 and/or another process chamber (e.g., process chamber 216, 218, another process chamber of another process tool) for performance of the one or more second operations.

Figure 6:
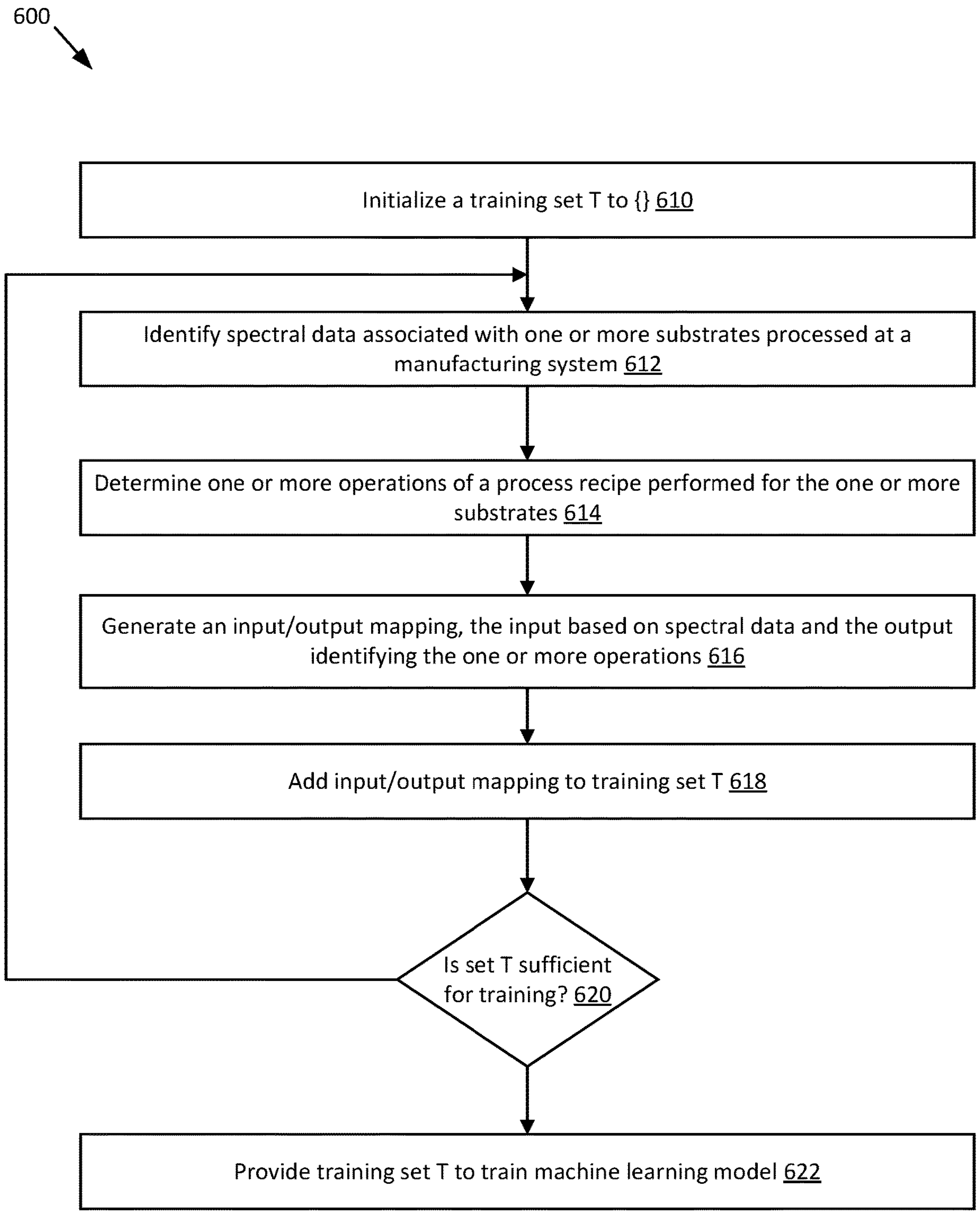
FIG. 6 is a flow chart of an example method for training a machine learning model, according to aspects of the present disclosure.

FIG. 6 is a flow chart of an example method 600 for training a machine learning model, according to aspects of the present disclosure. Method 600 is performed by processing logic that can include hardware (circuitry, dedicated logic, etc.), software (such as is run on a general-purpose computer system or a dedicated machine), firmware, or some combination thereof. In one implementation, method 600 can be performed by a computer system, such as computer system architecture 100 of FIG. 1. In other or similar implementations, one or more operations of method 500 can be performed by one or more other machines not depicted in the figures. In some aspects, one or more operations of method 600 can be performed by training set generator 172.

At block 610, process logic initialization a training set T to empty (e.g., { }). At block 612, process logic identifies spectral data associated with one or more substrates processed at a manufacturing system. In some embodiments, the spectral data can be generated by substrate measurement subsystem 300 for one or more substrates (e.g., substrates 202) processed according to operations of a process recipe at one or more of process chambers 214, 216, 218, in accordance with embodiments described above. In some embodiments, components of substrate measurement subsystem 300 can collect the spectral data while the substrate process is performed at a respective process chamber (e.g., process chamber 214). Accordingly, the spectral data collected for the substrates 202 can indicate a state of the substrate(s) 202 during each operation of the substrate process. In other or similar embodiments, the one or more substrate(s) 202 can be transferred from process chamber 214 to substrate measurement subsystem 300 after completion of one or more operations of the process recipe (e.g., before all operations of the process recipe are performed), as described above. The spectral data collected by substrate measurement subsystem 300 can indicate a state of the substrate(s) 202 after completion of the one or more operations and/or prior to completion of all operations of the process recipe. Controller 330 and/or system controller 228 can store the spectral data collected for the one or more substrates 202 at data store 140 (e.g., at spectral library 142), in some embodiments.

At block 614, process logic determines one or more operations of a process recipe performed for the one or more substrates. System controller 228 and/or another component of system 110 can store an indication of the process recipe performed for substrate(s) 202 at data store 140, as described herein. As described above, system controller 228 can transfer a substrate 202 to substrate measurement subsystem 300 for measurement after completion of one or more operations of a process recipe, in some embodiments. In such embodiments, system controller 228 and/or another component of system 110 can store an indication of the one or more operations of the process recipe that were completed at data store 140, as described above. In additional or alternative embodiments, components of substrate measurement subsystem 300 can collect spectral data during each operation of the process recipe (e.g., without substrate 202 being removed from process chamber 214). In such embodiments, system controller 228 and/or another component of system 100 can determine, based on process recipe data and/or performance logs for the substrate process, a start time period and an end time period for each operation of the process recipe. The system controller 228 and/or the other component can identify a portion of the spectral data that was collected between each start time period and each end time period and can associate the identified portion of the spectral data with a respective operation of the process recipe (e.g., by updating a mapping between the portion of the spectral data and an identifier for the respective operation). System controller 228 and/or the other component can store the association and/or the mapping at data store 140, as described above.

At block 616, process logic generates an input/output mapping, the input based on spectral data and the output identifying the one or more operations. In some embodiments, training set generator 172 can identify (e.g., at data store 140, at spectral library 142, etc.) spectral data collected for a substrate (e.g., as identified at block 610) and an indication of one or more operations performed for the substrate for which the spectral data was collected (e.g., as identified at block 612) and generate the input/output mapping. In some embodiments, the generated input/output mapping can correspond to the mapping between the portion of spectral data and the identifier for the respective operation generated by system controller 228 and/or another component of system 100, as described above. At block 618, process logic adds the input/output mapping to training set T. At block 620, process logic determines whether set T is sufficient for training. In response to process logic determining that training set T is not sufficient for training, method 600 returns to block 612. In response to process logic determining that training set T is sufficient for training, method 600 proceeds to block 622. At block 622, process logic provides training set T to train a machine learning model (e.g., model 190).

Figure 7:
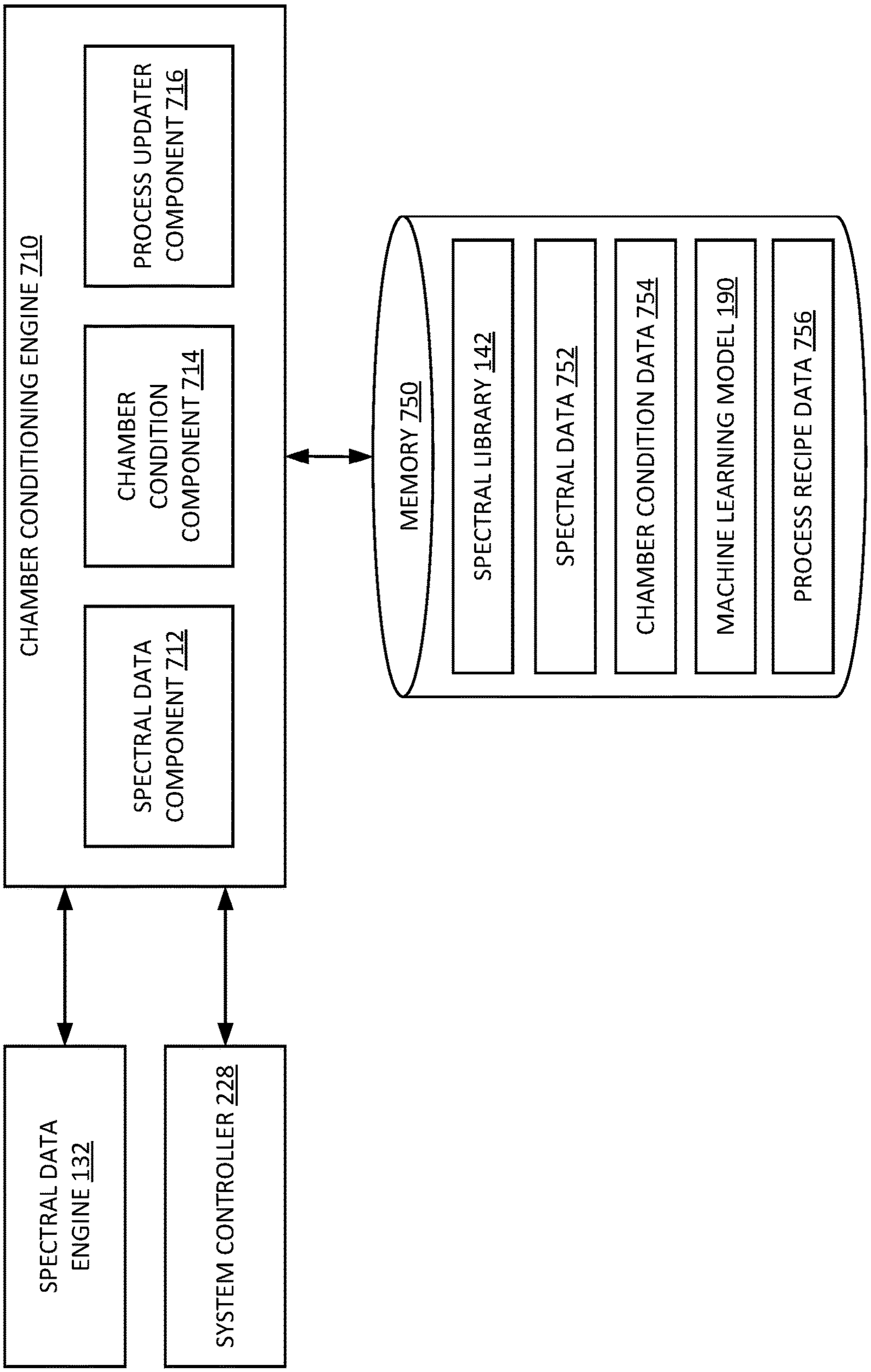
FIG. 7 depicts an example chamber conditioning engine, according to aspects of the present disclosure.

FIG. 7 depicts an example chamber conditioning engine 710, according to aspects of the present disclosure. As described above, chamber conditioning engine 710 can be part of spectral data engine 132, in some embodiments. In other or similar embodiments, chamber conditioning engine 710 can reside at a different computing system than the computing system that runs spectral data engine 132. In such embodiments, chamber conditioning engine 710 can be communicatively coupled to spectral data engine 132 and/or system controller 228 (e.g., via network 108, via a bus, etc.). As illustrated in FIG. 7, chamber conditioning engine 710 can include a spectral data component 712, a chamber condition component 714, and/or a process updater component 716. Chamber conditioning engine 710, spectral data engine 132, and/or system controller 228 can be coupled to memory 750 (e.g., via network 108, via a bus, etc.). In some embodiments, memory 750 can include one or more regions of data store 140 and/or any other memory of system 100.

Figure 8:
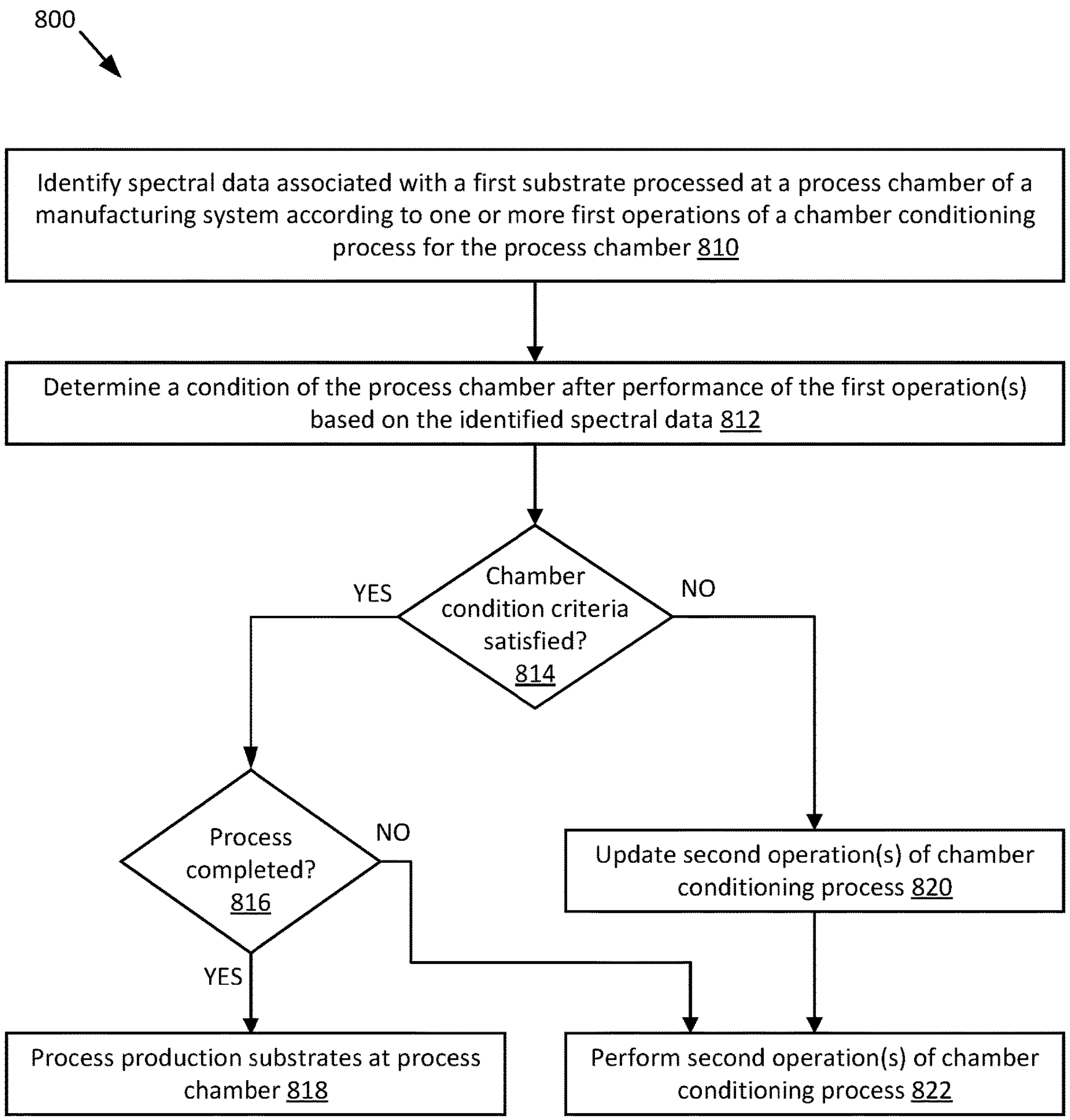
FIG. 8 is a flow chart of an example method for monitoring one or more conditioning operations at a process chamber, according to aspects of the present disclosure.

FIG. 8 is a flow chart of an example method 800 for monitoring one or more conditioning operations performed at a process chamber, according to aspects of the present disclosure. Method 800 is performed by processing logic that can include hardware (circuitry, dedicated logic, etc.), software (such as is run on a general-purpose computer system or a dedicated machine), firmware, or some combination thereof. In one implementation, method 800 can be performed by a computer system, such as computer system architecture 100 of FIG. 1. In other or similar implementations, one or more operations of method 800 can be performed by one or more other machines not depicted in the figures. In some aspects, one or more operations of method 800 can be performed by chamber conditioning engine 710.

At block 810, process logic identifies spectral data associated with a first substrate processed at a process chamber of a manufacturing system. In some embodiments, substrate 202 can be a conditioning substrate, as described herein. Substrate measurement subsystem 300 can collect spectral data for substrate 202 before, during, or after performance of one or more operations of a chamber conditioning process, in accordance with previously described embodiments. In some embodiments, controller 330 of substrate measurement subsystem 300 can provide the spectral data to system controller 228 and/or chamber conditioning engine 710, in accordance with previously described embodiments. Spectral data component 712 of chamber conditioning engine 710 can store the spectral data at memory 750 as spectral data 752. In some embodiments, spectral data component 712 can store spectral data 752 at spectral library 142.

At block 812, process logic determines a condition of the process chamber after performance of the first operation(s) based on the identified spectral data. As indicated above, spectral data 752 can indicate a state of substrate 202 before, during, or after performance or one or more operations (e.g., conditioning operations) of a process performed for the substrate at process chamber 214. The state of substrate 202 can be dependent on and/or otherwise relate to a condition of process chamber 214 before, during, and/or after performance of the one or more operations. Accordingly, the state of substrate 202, as indicated by spectral data 752, can correspond to the condition of process chamber 214. As described above, spectral library 142 can include one or more sets of spectral data collected for prior substrates processed according to one or more prior conditioning operations (e.g., of a prior initialization process and/or a prior maintenance process) at a process chamber (e.g., process chamber 214, 216, 218 and/or another process chamber). Each set of spectral data collected for a respective prior substrate can indicate a state of the respective substrate before, during, and/or after performance of the one or more prior conditioning operations. Accordingly, a respective set of spectral data can indicate a condition of a process chamber that performed the one or more conditioning operations for the respective substrate.

In some embodiments, chamber condition component 714 can compare spectral data 752 to one or more sets of spectral data of spectral library 142 and can identify a set of spectral data that corresponds to (e.g., matches or substantially matches) spectral data 752. The identified set of spectral data can indicate a state of a prior substrate before, during, and/or after performance of one or more prior conditioning operations, which can correspond to a state of the process chamber that processed the prior substrate before, during, and/or after the performance of the prior conditioning operation(s). Accordingly, chamber condition component 714 can determine the condition of the process chamber 214 that processed substrate 202 based on the identified set of spectral data of spectral library 142. In some embodiments, chamber condition component 714 can store an indication of the process chamber condition at memory 750 as chamber condition data 754.

In some embodiments, a machine learning model (e.g., model 190) can be trained using data of spectral library 142 to predict, based on given spectral data collected for a substrate (e.g., a conditioning substrate), a condition of a respective process chamber that processed the substrate.

Figure 9:
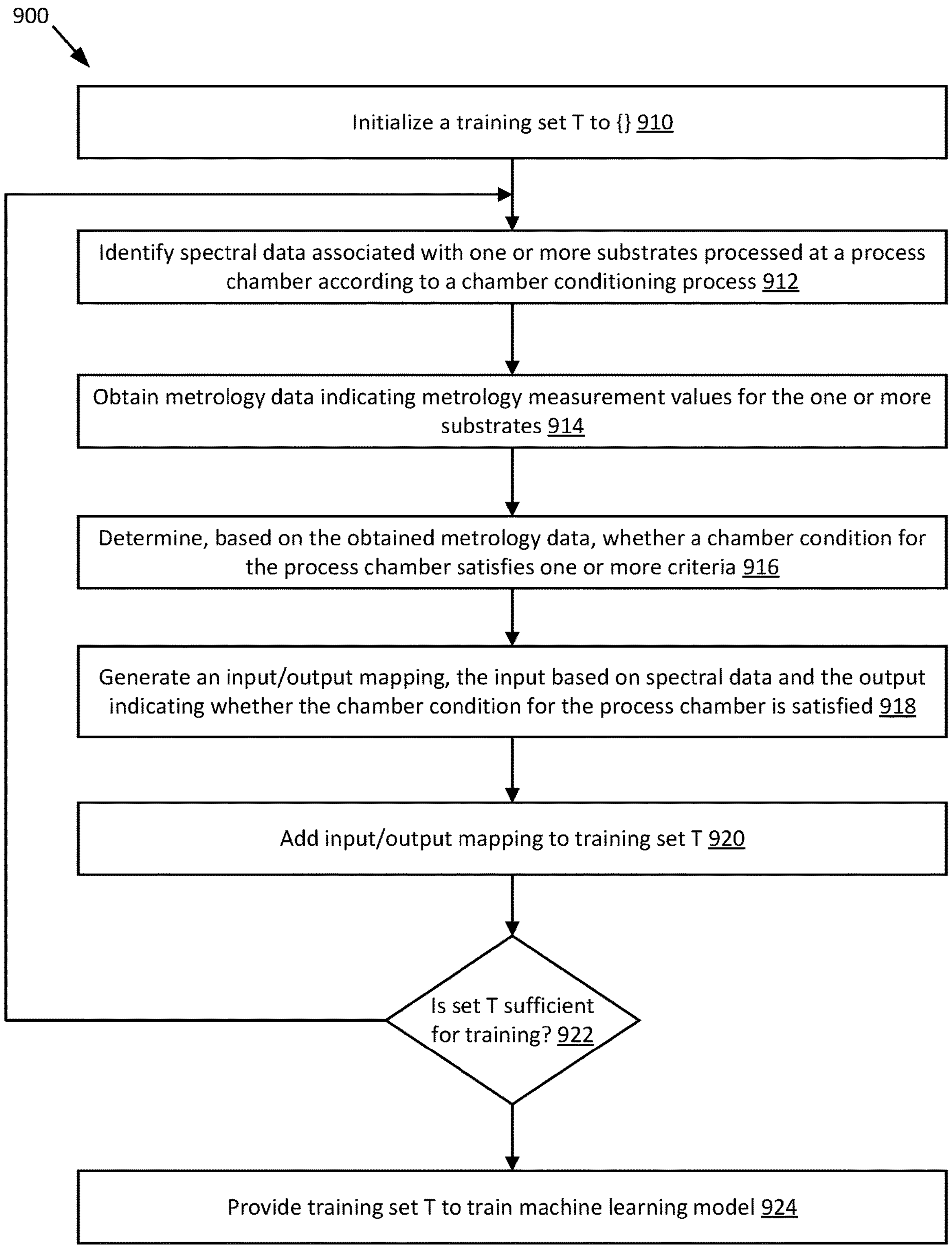
FIG. 9 is a flow chart of another example method for training a machine learning model, according to aspects of the present disclosure.

Details regarding training model 190 are provided with respect to FIG. 9. In some embodiments, chamber condition component 714 can provide spectral data 752 collected for substrate 202 as input to trained model 190 and obtain one or more outputs of the machine learning model. The one or more outputs of model 190 can include an indication of one or more process chamber conditions and, for each of the one or more process chamber conditions, an indication of a level of confidence that a respective process chamber condition is associated with the process chamber 214 that processed substrate 202. Chamber condition component 714 can determine a chamber condition associated with the process chamber 214 by identifying a process chamber condition of the one or more process chamber conditions of the output(s) of model 190 having a level of confidence that satisfies one or more confidence criteria (e.g., exceeds a threshold level of confidence, is larger than other levels of confidence associated with other process chamber conditions). Chamber condition component 714 can store the chamber condition associated with process chamber 214 (e.g., determined based on the outputs of model 190) at memory 750 as chamber condition data 754, as described above.

Referring back to FIG. 8, at block 814, process logic determines whether the condition of the process chamber satisfies one or more chamber condition criteria. In some embodiments, the condition of process chamber 214 can satisfy the chamber condition criteria if the condition of process chamber 214 corresponds to (e.g., matches or substantially matches) a target condition for the process chamber 214 after performance of the one or more conditioning operations that were performed at process chamber 214. In some embodiments, a target condition for process chamber 214 can be determined based on historical data and/or experimental data collected for one or more substrates and/or process chambers of manufacturing system 200 (and/or other manufacturing systems). In other or similar embodiments, the target condition for the process chamber can be provided (e.g., via client device 120) by an operator or engineer of manufacturing system 200.

Chamber condition component 714 can compare the determined condition of process chamber 214 to the target condition for the process chamber and determine whether the determined condition corresponds to the target condition. If so, chamber condition component 714 can determine that the chamber condition criteria are satisfied. If not, chamber condition component 714 can determine that the chamber condition criteria are not satisfied. In an illustrative example, one or more first conditioning operations can be performed at process chamber 214 for substrate 202. Chamber condition component 714 can determine the condition of process chamber 214 based on spectral data 752 collected for substrate 202, as described above, and compare the determined condition to a target condition of process chamber 714 after performance of the one or more first conditioning operations. Upon determining that the condition of process chamber 214 after performance of the one or more first conditioning operations corresponds to the target condition of process chamber 214 after performance of the first conditioning operation(s), chamber condition component 714 can determine that the condition of process chamber 214 satisfies the chamber condition criteria.

In response to process logic determining that the chamber condition criteria are satisfied, method 600 proceeds to block 816. In response to process logic determining that the chamber condition criteria are not satisfied, method 600 proceeds to block 820. At block 816, process logic determines whether the initialization process and/or maintenance process is completed. In some embodiments, chamber condition component 714 can determine whether the initialization process and/or maintenance process at process chamber 214 is completed by determining whether the condition of process chamber 214 corresponds to a target condition for a process chamber that has completed the initialization process and/or maintenance process. The target condition for the process chamber that has completed the initialization process and/or maintenance process can be determined based on historical and/or experimental data and/or can be provided by an operator or engineer of manufacturing system 200 (e.g., via client device 120), as described above. Upon determining that the condition of process chamber 214 corresponds to the target condition for a process chamber that has completed the initialization process and/or maintenance process, chamber condition component 714 can determine that the initialization process and/or maintenance process is completed.

In response to process logic determining that the conditioning process is completed, method 600 proceeds to block 818. At block 818, process logic causes production substrates to be processed at the process chamber. In response to process logic determining that the conditioning process is not completed, method 600 proceeds to block 822, described below. In some embodiments, chamber conditioning engine 710 can transmit a notification to system controller 228 indicating that the condition of process chamber 214 is suitable to process production substrates. System controller 228 can initiate processing of the production substrates in response to receiving the notification, in some embodiments. In additional or alternative embodiments, chamber conditioning engine 710 and/or system controller 228 can transmit a notification to client device 120 indicating that the condition of process chamber 214 is suitable to process production substrates. Client device 120 can provide the notification to a user of client device (e.g., an operator, an engineer, etc.) via a graphical user interface (GUI). The operator and/or engineer can initiate the processing of production substrates (e.g., via interaction with the GUI) based on the notification and/or can cause one or more conditioning substrates at process tool 204 to be transferred to additional testing equipment (e.g., metrology equipment 128) for further testing and/or validation.

Referring back to block 814, in response to process logic determining that the chamber condition criteria are not satisfied, method 600 proceeds to block 820. At block 820, process logic updates one or more second operations of the chamber conditioning process (e.g., the initialization process and/or the maintenance process). In some embodiments, process updater component 716 can determine one or more updates to be made to the process recipe associated with the initialization process and/or the maintenance process based on the determined condition for process chamber 214. In an illustrative example, spectral data 752 can indicate an etch rate for substrate 202, which is dependent on one or more conditions of process chamber 214. If the indicated etch rate does not correspond to the target etch rate of the target condition for process chamber 214, process updater component can determine one or more settings that are to be modified of the process recipe to cause the etch rate to correspond to the target etch rate. Process updater component 716 can store an indication of the updated settings at memory 750 as process recipe data 756, in some embodiments. In additional or alternative embodiments, process updater component 716 can transmit a notification to client device 120 indicating that the chamber condition of process chamber 214 does not correspond to the target condition. Client device 120 can provide the notification to an operator and/or engineer of manufacturing system 200 (e.g., via the GUI) of client device 120). The operator and/or engineer can provide an indication of one or more updates to be made to settings of the process recipe to cause the condition of process chamber 214 to correspond to the target condition. Client device 120 can transmit a notification indicating the updated settings to system controller 228 and/or process updater component 716. The updated settings can be stored at memory 750 as process recipe data 756, in some embodiments.

At block 822, process logic causes one or more second operations of the chamber conditioning process to be performed. Process logic can cause a second substrate (e.g., a conditioning substrate) to be processed according to the one or more second operations. In some embodiments, process updater component 716 can update one or more settings of a process recipe for the initialization process and/or the maintenance process to cause the condition of process chamber 214 to correspond to the target condition for process chamber 214, as described with respect to block 820. In such embodiments, system controller 228 can initiate one or more additional conditioning operations to be performed for one or more additional conditioning substrates according to the updated settings. After performance of the additional conditioning operations, substrate measurement subsystem 300 can collect spectral data associated with the conditioning substrates 202 and chamber condition engine 710 can determine the condition of process chamber 214, as described above.

As described with respect to block 816, in response to process logic determining that the conditioning process is not completed, method 600 proceeds to block 822. In such embodiments, system controller 228 can perform additional conditioning operations at the process chamber 214 according to the original (e.g., non-updated) settings for the conditioning operations. After performance of the additional conditioning operations, substrate measurement subsystem 300 can collect spectral data associated with the conditioning substrates 202 and chamber condition engine 710 can determine the condition of process chamber 214, as described above.

FIG. 9 is a flow chart of an example method for training a machine learning model, according to aspects of the present disclosure. Method 900 is performed by processing logic that can include hardware (circuitry, dedicated logic, etc.), software (such as is run on a general-purpose computer system or a dedicated machine), firmware, or some combination thereof. In one implementation, method 900 can be performed by a computer system, such as computer system architecture 100 of FIG. 1. In other or similar implementations, one or more operations of method 900 can be performed by one or more other machines not depicted in the figures. In some aspects, one or more operations of method 900 can be performed by training set generator 172.

At block 910, process logic initialization a training set T to empty (e.g., { }). At block 912, process logic identifies spectral data associated with one or more substrates processed at a manufacturing system according to a chamber conditioning process. In some embodiments, the spectral data can be generated by substrate measurement subsystem 300 for one or more substrates (e.g., substrates 202) processed according to conditioning operations of an initialization process and/or a maintenance process at one or more of process chambers 214, 216, 218, in accordance with embodiments described above. In some embodiments, components of substrate measurement subsystem 300 can collect the spectral data while a conditioning operation is performed at a respective process chamber (e.g., process chamber 214). Accordingly, the spectral data collected for the substrates 202 can indicate a state of the substrate(s) 202 and/or a condition of the process chamber 214 during the conditioning operation. In other or similar embodiments, the one or more substrate(s) 202 can be transferred from process chamber 214 to substrate measurement subsystem 300 after completion of the conditioning operation, as described above.

At block 914, process logic obtains metrology data indicating metrology measurement values for one or more substrates. In some embodiments, system controller 228 can cause one or more robotic arms of manufacturing system 200 to transfer substrate 202 out of process chamber 214 to metrology equipment 128. In some embodiments, metrology equipment 128 can be included at or otherwise coupled to process tool 204. In such embodiments, the robotic arms can transfer substrate 202 from process chamber 214 to metrology equipment 128. In other or similar embodiments, metrology equipment 128 can be external from process tool 204. In such embodiments, the robotic arms can transfer substrate 202 to factory interface 206. The substrate 202 can be transferred from factory interface 206 to metrology equipment 128 (e.g., manually by an operator or engineer of manufacturing system 200). Metrology equipment 128 can collect the metrology data for substrate 202 and can provide the collected metrology data to system controller 228 and/or another computing system for system 100, as described herein.

At block 916, process logic determines, based on the obtained metrology data, whether a chamber condition for the process chamber satisfies one or more criteria. In some embodiments, process logic determines whether the chamber condition for the process chamber satisfies the criteria by determining whether the collected metrology data for the substrate corresponds to (e.g., matches or substantially matches) target metrology data collected for a substrate processed in a chamber that satisfies the chamber condition. The target metrology data can be determined based on historical or experimental data and/or provided by an operator and/or engineer of manufacturing system 200 (e.g., via client device 120). If the collected metrology data corresponds to the target metrology data, process logic determines that the criteria are satisfied. If the collected metrology data does not correspond to the target metrology data, process logic determines that the criteria are not satisfied. At block 918, process logic generates an input/output mapping, the input based on spectral data and the output indicating whether the chamber condition for the process chamber is satisfied. In an illustrative example, the input/output mapping can include an indication of the spectral data collected for substrate 202 mapped to an indication of whether the condition of the chamber that processed substrate 202 satisfies the one or more criteria.

At block 920, process logic adds the input/output mapping to training set T. At block 922, process logic determines whether set T is sufficient for training. In response to process logic determining that training set T is not sufficient for training, method 900 returns to block 912. In response to process logic determining that training set T is sufficient for training, method 900 proceeds to block 924. At block 924, process logic provides training set T to train a machine learning model (e.g., model 190).

For simplicity of explanation, methods 500, 600, 800, and 900 are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

Figure 10:
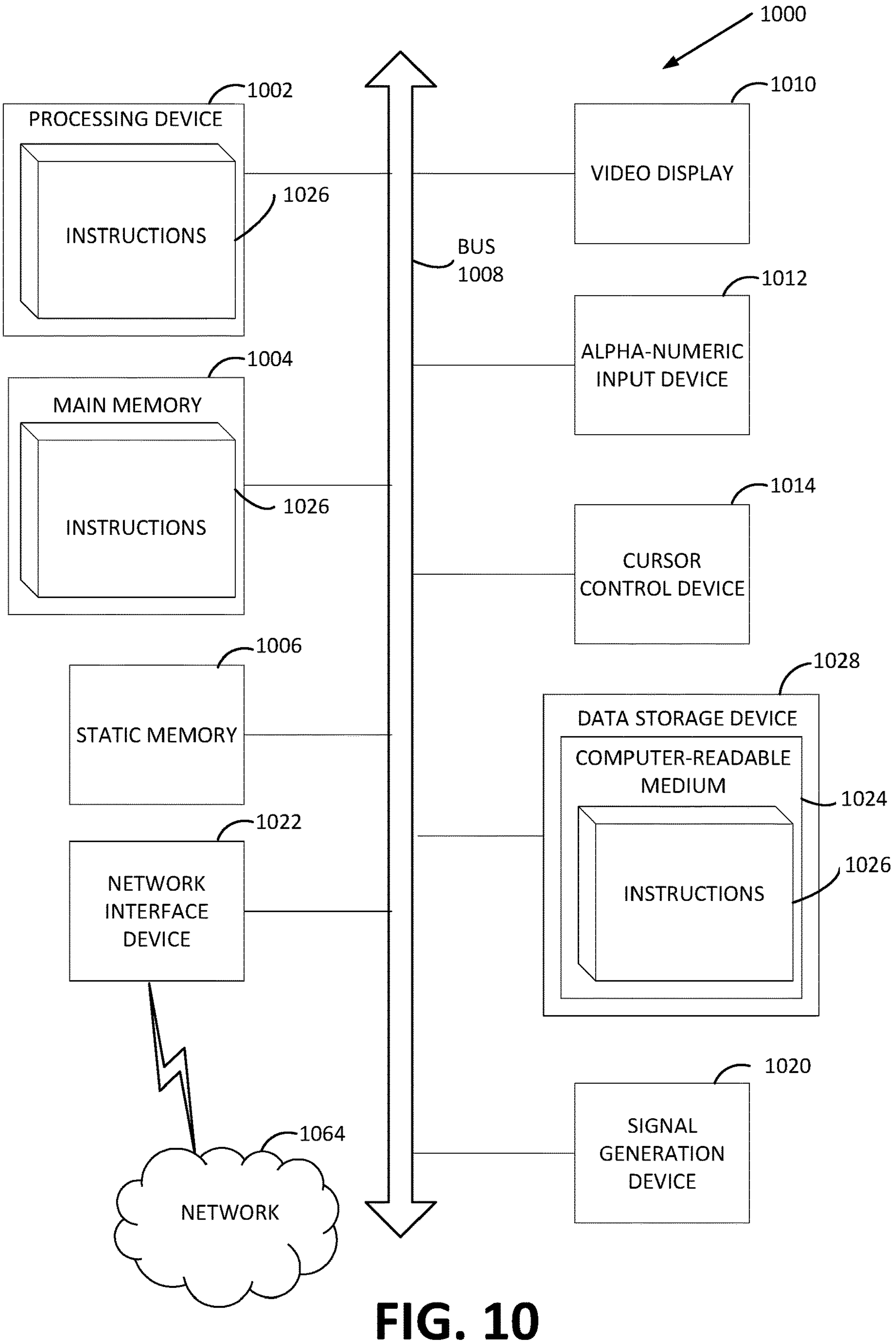
FIG. 10 depicts a block diagram of an illustrative computer system operating in accordance with one or more aspects of the present disclosure.

FIG. 10 depicts a block diagram of an illustrative computer system 1000 operating in accordance with one or more aspects of the present disclosure. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term “machine” shall also be taken to include any collection of machines (e.g., computers) that individually or jointly execute a set (or multiple sets) of instructions to perform any one or more of the methodologies discussed herein. In embodiments, computing device 1000 may correspond to predictive component 114 and/or spectral data engine 132 of FIG. 1, system controller 228 of FIG. 2 or controller 330 of FIG. 3.

The example computing device 1000 includes a processing device 1002, a main memory 1004 (e.g., read-only memory (ROM), flash memory, dynamic random access memory (DRAM) such as synchronous DRAM (SDRAM), etc.), a static memory 1006 (e.g., flash memory, static random access memory (SRAM), etc.), and a secondary memory (e.g., a data storage device 1028), which communicate with each other via a bus 1008.

Processing device 1002 may represent one or more general-purpose processors such as a microprocessor, central processing unit, or the like. More particularly, the processing device 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. Processing device 1002 may also be or include a system on a chip (SoC), programmable logic controller (PLC), or other type of processing device. Processing device 1002 is configured to execute the processing logic for performing operations and steps discussed herein.

The computing device 1000 may further include a network interface device 1022 for communicating with a network 1064. The computing device 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), and a signal generation device 1020 (e.g., a speaker).

The data storage device 1028 may include a machine-readable storage medium (or more specifically a non-transitory computer-readable storage medium) 1024 on which is stored one or more sets of instructions 1026 embodying any one or more of the methodologies or functions described herein. Wherein a non-transitory storage medium refers to a storage medium other than a carrier wave. The instructions 1026 may also reside, completely or at least partially, within the main memory 1004 and/or within the processing device 1002 during execution thereof by the computer device 1000, the main memory 1004 and the processing device 1002 also constituting computer-readable storage media.

The computer-readable storage medium 1024 may also be used to store model 190 and data used to train model 190. The computer readable storage medium 1024 may also store a software library containing methods that call model 190. While the computer-readable storage medium 1024 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

The following section includes examples of embodiments of the present disclosure. Such examples are provided for illustrative purposes only and are not intended to be limiting.

Example 1 is a method including: identifying spectral data associated with a substrate at a manufacturing system, where the substrate has been processed according to one or more first operations of a process recipe, and where the process recipe is unknown to a system controller for the manufacturing system; determining the process recipe associated with the substrate based on the identified spectral data; identifying one or more second operations of the process recipe that are yet to be performed for the substrate; and causing the substrate to be processed according to the one or more second operations of the process recipe.

Example 2 is a method of Example 1, where determining the process recipe associated with the substrate based on the identified spectral data includes: providing the identified spectral data as input to a machine learning model, where the machine learning model is trained to predict, based on given spectral data, a respective process recipe associated with one or more substrates at the manufacturing system and one or more operations of the respective process recipe that have already been performed for the one or more substrates; obtaining one or more outputs of the machine learning model; and extracting, from the one or more outputs of the machine learning model, data indicating the process recipe associated with the substrate and the one or more first operations of the process recipe that have already been performed for the substrate.

Example 3 is a method of Example 2, where identifying the one or more second operations of the process recipe that are yet to be performed for the substrate includes: identifying a set of operations associated with the process recipe, where the set of operations includes the one or more first operations and the one or more second operations; and extracting the one or more second operations from the identified set of operations associated with the process recipe.

Example 4 is a method of Example 2, where the machine learning model is trained using historical spectral data collected for one or more prior substrates processed according to at least one operation associated with the process recipe during a prior substrate process performed at the manufacturing system.

Example 5 is a method of Example 1, where the spectral data is generated based on one or more measurements of a substrate measurement subsystem for a processing tool including a process chamber used to process the substrate.

Example 6 is a method of Example 5, where the substrate measurement subsystem is configured to collect the spectral data associated with the substrate when the substrate is at the process chamber.

Example 7 is a method of Example 1, where causing the substrate to be processed according to the one or more second operations of the process recipe includes: transmitting a notification including an indication of the one or more second operations of the process recipe to the system controller for the manufacturing system.

Example 8 is a method of Example 1, where causing the substrate to be processed according to the one or more second operations of the process recipe includes: transmitting, by the system controller, a signal to at least one component of the manufacturing system to cause the component to initiate performance of the one or more second operations of the process recipe.

Example 9 is a method of Example 1, further including: prior to identifying the spectral data associated with the substrate at the manufacturing system, detecting that one or more components of the manufacturing system are inoperable for a time period.

Example 10 is a system including: a memory; and a processing device coupled to the memory, where the processing device is to perform operations including: identifying spectral data associated with a substrate at a manufacturing system, where the substrate has been processed according to one or more first operations of a process recipe, and where the process recipe is unknown to a system controller for the manufacturing system; determining the process recipe associated with the substrate based on the identified spectral data; identifying one or more second operations of the process recipe that are yet to be performed for the substrate; and causing the substrate to be processed according to the one or more second operations of the process recipe.

Example 11 is a system of Example 10, where determining the process recipe associated with the substrate based on the identified spectral data includes: providing the identified spectral data as input to a machine learning model, where the machine learning model is trained to predict, based on given spectral data, a respective process recipe associated with one or more substrates at the manufacturing system and one or more operations of the respective process recipe that have already been performed for the one or more substrates; obtaining one or more outputs of the machine learning model; and extracting, from one or more outputs of the machine learning model, data indicating the process recipe associated with the substrate and the one or more first operations of the process recipe that have already been performed for the substrate.

Example 12 is a system of Example 11, where identifying the one or more second operations of the process recipe that are yet to be performed for the substrate includes: identifying a set of operations associated with the process recipe, where the set of operations includes the one or more first operations and the one or more second operations; and extracting the one or more second operations from the identified set of operations associated with the process recipe.

Example 13 is a system of Example 11, where the machine learning model is trained using historical spectral data collected for one or more prior substrates processed according to at least one operation associated with the process recipe during a prior substrate process performed at the manufacturing system.

Example 14 is a system of Example 10, where the spectral data is generated based on one or more measurements of a substrate measurement subsystem for a processing tool including a process chamber used to process the substrate.

Example 15 is a system of Example 14, where the substrate measurement subsystem is configured to collect the spectral data associated with the substrate when the substrate is at a process chamber of the manufacturing system.

Example 16 is a system of Example 10, where causing the substrate to be processed according to the one or more second operations of the process recipe includes: transmitting a notification including an indication of the one or more second operations of the process recipe to the system controller for the manufacturing system.

Example 17 is a non-transitory computer readable medium includes instructions, which when executed by a processing device, cause the processing device to perform operations including: identifying spectral data associated with a substrate at a manufacturing system, where the substrate has been processed according to one or more first operations of a process recipe, and where the process recipe is unknown to a system controller for the manufacturing system; determining the process recipe associated with the substrate based on the identified spectral data; identifying one or more second operations of the process recipe that are yet to be performed for the substrate; and causing the substrate to be processed according to the one or more second operations of the process recipe.

Example 18 is a non-transitory computer readable medium of Example 17, where determining the process recipe associated with the substrate based on the identified spectral data includes: providing the identified spectral data as input to a machine learning model, where the machine learning model is trained to predict, based on given spectral data, a respective process recipe associated with one or more substrates at the manufacturing system and one or more operations of the respective process recipe that have already been performed for the one or more substrates; obtaining one or more outputs of the machine learning model; and extracting, from one or more outputs of the machine learning model, data indicating the process recipe associated with the substrate and the one or more first operations of the process recipe that have already been performed for the substrate.

Example 19 is a non-transitory computer readable medium of Example 18, where identifying the one or more second operations of the process recipe that are yet to be performed for the substrate includes: identifying a set of operations associated with the process recipe, where the set of operations includes the one or more first operations and the one or more second operations; and extracting the one or more second operations from the identified set of operations associated with the process recipe.

Example 20 is a non-transitory computer readable medium of Example 18, where the machine learning model is trained using historical spectral data collected for one or more prior substrates processed according to at least one operation associated with the process recipe during a prior substrate process performed at the manufacturing system.

Example 21 is a method including: identifying spectral data associated with a first substrate at a manufacturing system, where the first substrate has been processed at a process chamber of the manufacturing system according to one or more first operations of a chamber conditioning process for the process chamber; determining a condition of the process chamber after performance of the one or more first operations based on the identified spectral data; determining whether the condition of the process chamber satisfies one or more chamber condition criteria; responsive to determining that the condition of the process chamber fails to satisfy the one or more chamber condition criteria, updating one or more second operations of the chamber conditioning process to cause the condition of the process chamber to satisfy the one or more chamber condition criteria; and causing a second substrate to be processed at the process chamber according to the updated one or more second operations.

Example 22 is a method of Example 21, where determining the condition of the process chamber after the performance of the one or more first operations based on the identified spectral data includes: providing the identified spectral data as input to a machine learning model, where the machine learning model is trained to predict, based on given spectral data for a respective substrate, a condition of a respective process chamber of the manufacturing system that processed the substrate; obtaining one or more outputs of the machine learning model; and extracting, from the one or more outputs of the machine learning model data indicating the condition of the process chamber that processed the first substrate according to the one or more first operations of the chamber conditioning process.

Example 23 is a method of Example 22, where the data indicating the condition of the process chamber that processed the first substrate according to the one or more first operations includes an indication of an amount of drift of the spectral data associated with the first substrate and target spectral data associated with one or more priors substrate processed according to the one or more first operations of the chamber condition process, where a respective process chamber that processed the one or more prior substrates satisfied the one or more chamber condition criteria.

Example 24 is a method of Example 23, where determining whether the condition of the process chamber satisfies the one or more chamber condition criteria includes: determining whether the amount of drift of the spectral data associated with the first substrate and the target spectral data exceeds a threshold amount of drift.

Example 25 is a method of Example 22, where the machine learning model is trained using historical spectral data collected for one or more prior substrates processed according to at least one operation associated with the chamber conditioning process performed at the manufacturing system.

Example 26, is a method of Example 21, further including: responsive to determining that the condition of the process chamber satisfies the one or more chamber condition criteria, determining, based on the condition of the process chamber, whether the chamber conditioning process is complete; and responsive to determining that the chamber conditioning process is not complete, causing the second substrate to be processed at the process chamber according to the one or more second operations.

Example 27 is a method of Example 21, where the spectral data is generated based on one or more measurements of a substrate measurement subsystem for a processing tool including the process chamber.

Example 28 is a method of Example 27, where the substrate measurement subsystem is configured to collect the spectral data associated with the substrate when the substrate is at the process chamber.

Example 29 is a system including: a memory; and a processing device coupled to the memory, where the processing device is to perform operations including: identifying spectral data associated with a first substrate at a manufacturing system, where the first substrate has been processed at a process chamber of the manufacturing system according to one or more first operations of a chamber conditioning process for the process chamber; determining a condition of the process chamber after performance of the one or more first operations based on the identified spectral data; determining whether the condition of the process chamber satisfies one or more chamber condition criteria; responsive to determining that the condition of the process chamber fails to satisfy the one or more chamber condition criteria, updating one or more second operations of the chamber conditioning process to cause the condition of the process chamber to satisfy the one or more chamber condition criteria; and causing a second substrate to be processed at the process chamber according to the updated one or more second operations.

Example 30 is a system of Example 29, where determining the condition of the process chamber after the performance of the one or more first operations based on the identified spectral data includes: providing the identified spectral data as input to a machine learning model, where the machine learning model is trained to predict, based on given spectral data for a respective substrate, a condition of a respective process chamber of the manufacturing system that processed the substrate; obtaining one or more outputs of the machine learning model; and extracting, from the one or more outputs of the machine learning model data indicating the condition of the process chamber that processed the first substrate according to the one or more first operations of the chamber conditioning process.

Example 31 is a system of Example 30, where the data indicating the condition of the process chamber that processed the first substrate according to the one or more first operations includes an indication of an amount of drift of the spectral data associated with the first substrate and target spectral data associated with one or more priors substrate processed according to the one or more first operations of the chamber condition process, where a respective process chamber that processed the one or more prior substrates satisfied the one or more chamber condition criteria.

Example 32 is a system of Example 31, where determining whether the condition of the process chamber satisfies the one or more chamber condition criteria includes: determining whether the amount of drift of the spectral data associated with the first substrate and the target spectral data exceeds a threshold amount of drift.

Example 33 is a system of Example 30, where the machine learning model is trained using historical spectral data collected for one or more prior substrates processed according to at least one operation associated with the chamber conditioning process performed at the manufacturing system.

Example 34 is a system of Example 29, where the operations further include: responsive to determining that the condition of the process chamber satisfies the one or more chamber condition criteria, determining, based on the condition of the process chamber, whether the chamber conditioning process is complete; and responsive to determining that the chamber conditioning process is not complete, causing the second substrate to be processed at the process chamber according to the one or more second operations.

Example 35 is a system of Example 29, where the spectral data is generated based on one or more measurements of a substrate measurement subsystem for a processing tool including the process chamber.

Example 36 is a non-transitory computer readable medium including instructions, which when executed by a processing device, cause the processing device to perform operations including: identifying spectral data associated with a first substrate at a manufacturing system, where the first substrate has been processed at a process chamber of the manufacturing system according to one or more first operations of a chamber conditioning process for the process chamber; determining a condition of the process chamber after performance of the one or more first operations based on the identified spectral data; determining whether the condition of the process chamber satisfies one or more chamber condition criteria; responsive to determining that the condition of the process chamber fails to satisfy the one or more chamber condition criteria, updating one or more second operations of the chamber conditioning process to cause the condition of the process chamber to satisfy the one or more chamber condition criteria; and causing a second substrate to be processed at the process chamber according to the updated one or more second operations.

Example 37 is a non-transitory computer readable medium of Example 36, where determining the condition of the process chamber after the performance of the one or more first operations based on the identified spectral data includes: providing the identified spectral data as input to a machine learning model, where the machine learning model is trained to predict, based on given spectral data for a respective substrate, a condition of a respective process chamber of the manufacturing system that processed the substrate; obtaining one or more outputs of the machine learning model; and extracting, from the one or more outputs of the machine learning model data indicating the condition of the process chamber that processed the first substrate according to the one or more first operations of the chamber conditioning process.

Example 38 is a non-transitory computer readable medium of Example 37, where the data indicating the condition of the process chamber that processed the first substrate according to the one or more first operations includes an indication of an amount of drift of the spectral data associated with the first substrate and target spectral data associated with one or more priors substrate processed according to the one or more first operations of the chamber condition process, where a respective process chamber that processed the one or more prior substrates satisfied the one or more chamber condition criteria.

Example 39 is a non-transitory computer readable medium of Example 38, where determining whether the condition of the process chamber satisfies the one or more chamber condition criteria includes determining whether the amount of drift of the spectral data associated with the first substrate and the target spectral data exceeds a threshold amount of drift.

Example 40 is a non-transitory computer readable medium of Example 37, where the machine learning model is trained using historical spectral data collected for one or more prior substrates processed according to at least one operation associated with the chamber conditioning process performed at the manufacturing system.

What is claimed is:

1. A method comprising:

identifying spectral data associated with a substrate processed at a process chamber of a manufacturing system according to one or more first operations of a process recipe, wherein the process recipe is unknown to a system controller of the manufacturing system, and wherein the spectral data is generated based on one or more measurements of a substrate measurement subsystem for the process chamber;

determining the process recipe associated with the substrate based on the identified spectral data;

identifying one or more second operations of the process recipe for the substrate; and causing the substrate to be processed according to the one or more second operations of the process recipe.

2. The method of claim 1, wherein determining the process recipe associated with the substrate based on the identified spectral data comprises:

providing the identified spectral data as input to a machine learning model, wherein the machine learning model is trained to predict, based on given spectral data, a respective process recipe associated with one or more substrates at the manufacturing system and one or more operations of the respective process recipe that have already been performed for the one or more substrates;

receiving one or more outputs of the machine learning model; and extracting, from the one or more outputs of the machine learning model, data indicating the process recipe associated with the substrate and the one or more first operations of the process recipe that have already been performed for the substrate.

3. The method of claim 2, wherein identifying the one or more second operations of the process recipe for the substrate comprises:

identifying a set of operations associated with the process recipe, wherein the set of operations comprises the one or more first operations and the one or more second operations; and extracting the one or more second operations from the identified set of operations associated with the process recipe.

4. The method of claim 2, wherein the machine learning model is trained using historical spectral data collected for one or more prior substrates processed according to at least one operation associated with the process recipe during a prior substrate process performed at the manufacturing system.

5. The method of claim 1, wherein the substrate measurement subsystem is configured to collect the spectral data associated with the substrate when the substrate is at the process chamber.

6. The method of claim 1, wherein causing the substrate to be processed according to the one or more second operations of the process recipe comprises:

transmitting a notification comprising an indication of the one or more second operations of the process recipe to the system controller for the manufacturing system.

7. The method of claim 1, wherein causing the substrate to be processed according to the one or more second operations of the process recipe comprises:

transmitting, by the system controller, a signal to at least one component of the manufacturing system to cause the component to initiate performance of the one or more second operations of the process recipe.

8. The method of claim 1, further comprising:

prior to identifying the spectral data associated with the substrate at the manufacturing system, detecting that one or more components of the manufacturing system are inoperable for a time period.

9. A system comprising:

a memory; and a processing device coupled to the memory, wherein the processing device is to perform operations comprising:

identifying spectral data associated with a substrate processed at a process chamber of a manufacturing system according to one or more first operations of a process recipe, wherein the process recipe is unknown to a system controller for the manufacturing system, and wherein the spectral data is generated based on one or more measurements of a substrate measurement subsystem for the process chamber;

determining the process recipe associated with the substrate based on the identified spectral data;

identifying one or more second operations of the process recipe for the substrate; and causing the substrate to be processed according to the one or more second operations of the process recipe.

10. The system of claim 9, wherein determining the process recipe associated with the substrate based on the identified spectral data comprises:

providing the identified spectral data as input to a machine learning model, wherein the machine learning model is trained to predict, based on given spectral data, a respective process recipe associated with one or more substrates at the manufacturing system and one or more operations of the respective process recipe that have already been performed for the one or more substrates;

obtaining one or more outputs of the machine learning model; and extracting, from the one or more outputs of the machine learning model, data indicating the process recipe associated with the substrate and the one or more first operations of the process recipe that have already been performed for the substrate.

11. The system of claim 10, wherein identifying the one or more second operations of the process recipe for the substrate comprises:

identifying a set of operations associated with the process recipe, wherein the set of operations comprises the one or more first operations and the one or more second operations; and extracting the one or more second operations from the identified set of operations associated with the process recipe.

12. The system of claim 10, wherein the machine learning model is trained using historical spectral data collected for one or more prior substrates processed according to at least one operation associated with the process recipe during a prior substrate process performed at the manufacturing system.

13. The system of claim 9, wherein the substrate measurement subsystem is configured to collect the spectral data associated with the substrate when the substrate is at the process chamber of the manufacturing system.

14. The system of claim 9, wherein causing the substrate to be processed according to the one or more second operations of the process recipe comprises:

transmitting a notification comprising an indication of the one or more second operations of the process recipe to the system controller for the manufacturing system.

15. A non-transitory computer readable medium comprising instructions, which when executed by a processing device, cause the processing device to perform operations comprising:

identifying spectral data associated with a substrate processed at a process chamber of a manufacturing system according to one or more first operations of a process recipe, wherein the process recipe is unknown to a system controller for the manufacturing system, and wherein the spectral data is generated based on one or more measurements of a substrate measurement subsystem for the process chamber;

determining the process recipe associated with the substrate based on the identified spectral data;

identifying one or more second operations of the process recipe for the substrate; and causing the substrate to be processed according to the one or more second operations of the process recipe.

16. The non-transitory computer readable medium of claim 15, wherein determining the process recipe associated with the substrate based on the identified spectral data comprises:

providing the identified spectral data as input to a machine learning model, wherein the machine learning model is trained to predict, based on given spectral data, a respective process recipe associated with one or more substrates at the manufacturing system and one or more operations of the respective process recipe that have already been performed for the one or more substrates;

obtaining one or more outputs of the machine learning model; and extracting, from the one or more outputs of the machine learning model, data indicating the process recipe associated with the substrate and the one or more first operations of the process recipe that have already been performed for the substrate.

17. The non-transitory computer readable medium of claim 16, wherein identifying the one or more second operations of the process recipe for the substrate comprises:

identifying a set of operations associated with the process recipe, wherein the set of operations comprises the one or more first operations and the one or more second operations; and extracting the one or more second operations from the identified set of operations associated with the process recipe.

18. The non-transitory computer readable medium of claim 16, wherein the machine learning model is trained using historical spectral data collected for one or more prior substrates processed according to at least one operation associated with the process recipe during a prior substrate process performed at the manufacturing system.

* * * * *